United States Patent
Cairncross et al.

[19]

[11] Patent Number: 6,143,374
[45] Date of Patent: *Nov. 7, 2000

[54] METHOD FOR PRECISE PLACEMENT OF AN ARRAY OF SINGLE PARTICLES ON A SURFACE

[75] Inventors: Allan Cairncross; John Edwin Gantzhorn, Jr., both of Hockessin, Del.

[73] Assignee: E. I. du Pont de Nemours and Company, Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 09/018,669

[22] Filed: Feb. 4, 1998

[51] Int. Cl.⁷ ....................................................... B05D 1/12
[52] U.S. Cl. .......................... 427/533; 427/180; 427/199; 427/204; 427/205; 427/346; 427/475
[58] Field of Search ..................................... 427/180, 475, 427/199, 346, 533, 202, 204, 205, 314

[56] References Cited

U.S. PATENT DOCUMENTS

| | | |
|---|---|---|
| 4,076,536 | 2/1978 | Schlesinger et al. . |
| 4,517,143 | 5/1985 | Kisler ......................................... 264/22 |
| 5,167,989 | 12/1992 | Dudek et al. ............................ 427/202 |
| 5,323,947 | 6/1994 | Juskey et al. ........................... 228/56.3 |
| 5,356,751 | 10/1994 | Cairncross et al. ..................... 450/253 |
| 5,616,206 | 4/1997 | Sakatsu et al. ......................... 156/230 |
| 5,687,901 | 11/1997 | Hoshiba et al. ........................ 228/246 |

FOREIGN PATENT DOCUMENTS

| | | |
|---|---|---|
| 0 840 368 A2 | 3/1989 | European Pat. Off. . |
| 3 307 591 A2 | 3/1989 | European Pat. Off. . |
| 0 685 879 A1 | 12/1995 | European Pat. Off. . |
| 2-54932 | 2/1990 | Japan . |
| 2-295186 | 12/1990 | Japan . |
| 6-333930 | 12/1994 | Japan . |

*Primary Examiner*—Fred J. Parker

[57] ABSTRACT

Methods and apparatus are disclosed for efficiently and precisely adhering and centering particles on tacky areas on a surface containing an array of tacky and non-tacky areas. These methods and apparatus for particle attachment and centering involve holding and heating of the surface containing an array of tacky and non-tacky areas with particles adhered thereon for a period of time and at a temperature to allow the particles to adhere and center to the tacky areas. The surface containing the array of tacky and non-tacky areas can be heated either prior to, during or after a step of contacting the array with particles. Either discrete sheets or a continuous moving web of material having a surface containing an array of tacky and non-tacky areas can be employed. Each tacky area of an array of tacky and non-tacky areas has a size and bonding strength suitable for adhesion of one particle thereto in formation of an array. The array is populated with conductive-particles, is useful in the precise placement of particles on contact pads of electronic devices, such as circuit boards in semiconductor applications.

38 Claims, 7 Drawing Sheets

METHOD FOR PRECISE PLACEMENT OF AN ARRAY OF SINGLE PARTICLES ON A SURFACE

BACKGROUND OF THE INVENTION

This invention relates to an improved method for efficiently and precisely adhering and centering particles to the tacky areas on a surface containing an array of tacky and non-tacky areas and removing particles from the non-tacky areas without removing the particles from the tacky areas. This net adhering of particles on the surface only to the tacky areas is termed net population of the surface (with the particles).

The placement of particles, such as electrically conductive solder, on contact pads is critical to the adoption of array style semiconductor packages such as ball grid arrays (BGA). Such placement is also critical in the attachment of integrated circuits (IC) to packages or printed circuit boards through "flip chip" processes. Recent attempts have been made to improve, for example, solder ball interconnects, such that more reliable and/or less costly solder connections are made in electronic applications. Despite these efforts, there are still problems associated with the handling and transfer of particles, primarily conductive particles such as solder balls to form solder bumps, on the contact pads of electronic devices. However, there is still a need for further improvements, particularly with regard to the efficiency, precision, and robustness of the population process(es). As a result, improved products and methods remain a primary objective in this art area.

SUMMARY OF THE INVENTION

The present invention is directed to an improved method for mounting particles on a surface having an array of tacky and non-tacky areas thereon, comprising the steps of:

(a) obtaining the surfaces having an array of tacky and non-tacky areas thereon;

(b) flowing the particles across the surface to allow particles to contact the tacky areas and adhere thereto; and (c) removing the excess particles not adhered to the tacky areas;

whereby heating to a temperature of at least 30° C. takes place prior to step (c).

Further embodiments of the invention include a step of agitating the surface having the array of tacky and non-tacky areas with an agitation rate of less than 1000 cycles per minute, using ionized air to partially neutralize electrostatic charges, use of holding times to obtain improved results and transfer of particles such as in manufacture of an electronic device.

In a further embodiment heating is not essential provided the particles are applied to the surface with tacky and non-tacky areas by agitation, such as vibration and use of hold times of the particles on the surface prior removal of excess particles and transfer to a substrate such as in manufacture of an electronic device.

DETAILED DESCRIPTION OF THE INVENTION

Figure 1:
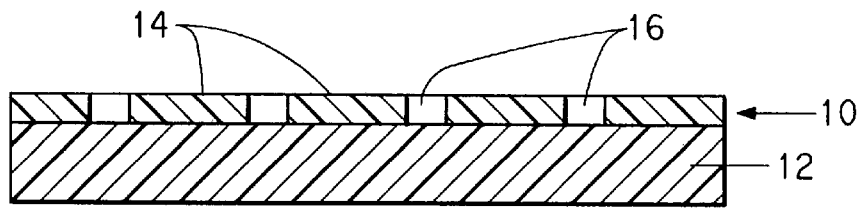
FIG. 1 is a simplified section view of one embodiment of a surface having an array of tacky and non-tacky areas thereon, which surface is suitable for use with the inventive process, wherein the tacky and non-tacky areas are disposed coplanar with one another.

This invention is an improved process for precisely and efficiently adhering particles to the tacky areas on a surface of a substrate having an array of tacky and non-tacky areas and removing particles from the non-tacky areas without removing particles from the tacky areas. This net adhering of particles to the tacky areas on the surface is termed net population of the substrate. For most applications of this invention, it is desired that there be one and only one particle attached to each tacky area of the substrate. The present invention is an improved process for the net population of this type of substrate having an array of tacky and non-tacky areas with particles only on the tacky areas.

An important embodiment of the present invention includes a heating step of at least 30° C. in at least one of the following: (a) for the surface having an array of tacky and non-tacky areas, (b) for the particles applied to the surface and (c) subsequent to application of the particles to the surface. However, if a heating step of at least 30° C. is undertaken in either step (a) or step (b), a preferred embodiment for holding the particles after application can be at a temperature as low as 20° C.

In a further embodiment, but less preferred, heating need not take place provided the particles are applied to a surface which is agitated at a frequency of at least 1000 cycles per minute and provided a hold time of at least two minutes is present after application of the particles to the tacky and non-tacky areas, i.e., excess particles are not removed from the areas.

Surprisingly, in a preferred embodiment it has been found that the efficiency of net population of a substrate having an array of tacky and non-tacky areas is dramatically increased when the surface having an array of tacky and non-tacky areas with particles adhered thereon is held for a period of time and at a temperature of at least 20° C. to allow the particles to adhere better to the tacky areas. The examples which are given below fully exemplify this dramatic increase in net population efficiency with only a modest increase in the hold time and substrate temperature during the population process. It is to be understood that the term efficiency of net population as used herein is a net or overall number in percent that takes into account the efficiency of population of the tacky areas with particles, minus the efficiency of depopulation of the tacky areas with the particles that are initially populated, and the efficiency of removal of particles from the non-tacky areas. The following equation is applicable:

$$OEP = EPT + EPNT - EDPT - EDPNT$$

where

OEP=net or overall efficiency of population in percent

EPT=efficiency of initial population of tacky areas in percent

EPNT=efficiency of population non-tacky areas in percent of tacky sites

EDPT=efficiency of subsequent depopulation from tacky sites in percent (of tacky sites that were initially populated)

EDPNT=efficiency of depopulation non-tacky areas in percent of tacky sites

Since the number of particles that are flowed across the surface in step (b) is normally and preferably a very large excess and since most of these excess particles remain on the surface in non-tacky areas the number of excess particles is difficult to count and the quantity EPNT in the equation above becomes difficult to determine. Likewise EPT is unmeasurable because the populated sites are obscured by the excess particles.

A useful way to describe the result of the process is to classify the number and type of deviations or errors from a perfect result, i.e., one particle per tacky area.

$$TE = V + TW + EX$$

where

TE=total errors per article

V=total number of vacant tacky areas per article

TW=total number of extra particles associated with a tacky area or "twins" per article EX=total number of extra particles left on non-tacky areas per article Then the error rate ER for the populated surface becomes $$ER = 1,000,000(TE)/TA$$

where

ER=error rate in parts per million (ppm) tacky areas

TA=total number of tacky areas per article

TE=total errors per article

The improved net population process of this invention is discussed in detail below. Before the improved net population process is discussed, however, it is important to give an overall framework to this technology area involving the use of substrates having tacky and non-tacky areas in applications such as precisely transferring arrays of solder balls to electronic parts. This discussion is given in the section immediately below, and then detailed discussion of the improved process is given in the subsequent section.

Substrates having Arrays of Tacky and Non-Tacky Areas and Associated Methods

The array and method described herein are particularly suited for use with free-flowing particles. By "free-flowing" is meant that there is no substantial binding force to be overcome when separating a mass of particles into separate discrete particles and that the particles do not stick to one another or clump together under normal conditions of use. A discussion of particle to particle binding forces is presented in U.S. Pat. No. 5,356,751.

For most electronic applications, the preferred particles for use in connection with this invention are electrically conductive materials, such as Cu, In, Pb, Sn, Au, and alloys thereof. Most preferred are solder balls. It will be apparent to those skilled in the art, however, that the type of particle used in connection with the present invention is dictated by the particular application and is not an inherent limitation of the invention. For example, a particular application may require that an electrically insulating material be applied to a solder bump on a contact pad; e.g., to space one contact pad from another in a stack of circuit boards. The present invention may be used to advantage in such circumstances. Generally speaking, spherical particles will be preferred in the practice of this invention because of their ease in handling and particle symmetry. It is to be understood, however, that the size and shape of the particles are not critical to the invention. For example, slightly off-round particles such as seeds work well with this invention.

For other applications outside electronics, the particles can have properties without any particular limits except for the limitation that the particles must have sufficient compatibility with the tacky areas such that the adhesive force bonding each particle to a given tacky area is at least the minimal value specified herein (i.e., at least 2 grams/mm$^2$). The particles such as beads can either be electrically conductive or electrically non-conductive such as glass; organic, inorganic, organometallic, or mixtures thereof; polymeric or non-polymeric; and living or non-living. Examples of suitable particles for this invention include, but are not limited to, mineral grains, chemical products, salt and sugar granules, polymer particles, mechanically ground solids, pollen, spores, and seeds. Some specific chemical product particles are alumina and silica; some specific polymer particles are poly(styrene), poly (methylmethacrylate) and poly(ethylene). Organic, inorganic, or organometallic chemical compounds that are pharmaceuticals, herbicides, pesticides, or have other biological activity are suitable particles for this invention; these compounds can be present at levels lower than or equal to 100% of the particle composition. If lower, other components can be present in the particles without limit. The particles can comprise any gas(es) and/or liquid(s) compounded with (e.g. absorbed on) any solid(s). For example, particles comprising dimethylsulfoxide (a liquid) absorbed onto alumina (a solid) are suitable in this invention.

As used herein, the term "tacky areas" means areas having adhesive properties to enable a bond to form immediately upon contact with free-flowing particles under low pressure (e.g., the weight of the particles). Each tacky area should have a size and bonding strength suitable for adhesion of one free-flowing particle. In accordance with this invention, the tacky areas have a size and bonding strength suitable for adhesion of one particle per tacky area. Typically, the tacky areas are small shapes (i.e., dots) from about 0.25 um to 1000 um and for many embodiments they are from about 10 um to 500 um. The tacky area shapes may be circular, square, rectangular, oval, or another shape suitable for retention of the particle. Generally, circular shaped tacky areas are preferred.

The spacing of the tacky areas is such that the position of one particle on one tacky area relative to the position of other particles on adjacent tacky areas matches the distance between and relative position of the contact pads of the electronic device to which the particles will become attached. The location of the tacky areas at least must allow the particles to touch some part of the contact pad to which it will become attached. In the embodiment where the particle melts (e.g., solder particles in contact with solder flux and a metallized contact pad), direct contact is required between the molten particle and the pad so that the molten particle can wet the pad and flow across the metal surface to cover the metallized pad. The initial contact of the particle with the metallized contact pad may be off-center because the wetting action of the molten particle will center the particle over the pad during attachment. For these noncritical embodiments, the original pattern of tacky areas is such that the location of each tacky area must align and overlap somewhere within the area of the corresponding contact pad area to which it will attach, and the size of the tacky area must be smaller than the particle so that only one particle is attached to each tacky area. Typically, for a tacky area having a particular size and bonding strength, there is an upper limit to the size and weight of particle, above which there is no substantial particle adherence, and there is a lower limit to the size particle which will adhere singly to each tacky area. For tacky areas with a tackiness of 2 to 6 grams/mm$^2$ and particles of 0.127 to 0.762 mm (0.005 to 0.030 inch) diameters, the tacky area may be as small as 15% of the particle diameter to as large as 100% of the particle diameter and still get single particle attachment per tacky area. A tacky area of 30 to 60% of the particle diameter is preferred.

In cases where the contact pads are close together relative to the size of the particle, care must be taken so that the particles on adjacent tacky areas do not touch before and during attachment to the contact pads so as to avoid bridging adjacent contact pads. As the space between contact pads become smaller relative to the width of the pad and hence, to the width of the particle to be attached to the contact pad, it becomes critical to align the tacky areas and particles closer to the center of the matching contact pads to which the particle will become attached. This is accomplished by centering the tacky area positions in the imaging step to match the center of the contact pads and using a combination of smaller tacky areas and the optimum combination of tacky area thickness and diameter for the particular surface curvature of the particle to achieve self-centering of the particle in the tacky area (see later discussion of self-centering).

Single particle attachment to each tacky area is assured when the size of the particle is large enough to cover the tacky area upon attachment, thus preventing further particles from ever touching the tacky area of an occupied tacky area. For the preferred embodiments of spherical particles and circular tacky dot areas, this is achieved once the diameter of the tacky dot area is less than the diameter of the smallest particle. A narrow size range for the particles is also desired to control the volume after the particle is attached to the contact pad. A uniform particle diameter is also desired for good contact between particles attached to tacky areas on a transfer substrate and the contact pads of the electronic device to which the particle is to be transferred. A size range of ±10% for the particle diameter is preferred.

The array of tacky and non-tacky areas preferably has clearly defined tacky areas and has no foreign material adhered thereto. Preferably, the non-tacky areas are flat and smooth and are either disposed coplanar with the tacky areas or the tacky areas are disposed below the plane of the non-tacky areas. Most preferably, the non-tacky areas are flat and smooth and are disposed co-planar with the tacky areas. Although less preferred, the tacky areas may be disposed above the plane of the non-tacky areas. In each of these cases, there can be material at the interface of a given tacky area with the non-tacky area that is slightly out of plane right at the interface (either above or below the plane of the interface even starting with a coplanar substrate prior to imaging to form the array of tacky and non-tacky areas). While not being bound by any theory, it is believed in the case of a photopolymer layer that this effect results from the diffusion of unpolymerized components from the tacky areas into the non-tacky areas thickening the border around the tacky areas. Also lightly crosslinked tacky areas are less dense and slightly thicker than more highly crosslinked non-tacky areas.

In a particularly preferred embodiment, the array of tacky and non-tacky areas comprises a photosensitive element that has been imagewise exposed to create the array. A variety of positive and negative photosensitive compositions are known to produce tacky images and may be used in the practice of this invention. Phototackifiable compositions become tacky where struck by light and are exemplified by compositions described in U.S. Pat. No. 5,093,221, U.S. Pat. No. 5,071,731, U.S. Pat. No. 4,294,909, U.S. Pat. No. 4,356,252 and German Patent No. 3,514,768. Photohardenable compositions are those which become hardened in light struck areas. A number of photohardenable compositions include CROMALIN® Positive Proofing Film SN 556548, Cromalin® 4BX, SURPHEX™ (embossable photopolymer film, CROMATONE® Negative Overlay Film SN 031372, and CROMALIN® Negative Film C/N all available from E. I. du Pont de Nemours and Company, Wilmington, Del. CROMALIN® Positive Film SN 556548, CROMALIN® 4BX and SURPHEX™ are preferred. These and other photosensitive products are disclosed in U.S. Pat. No. 3,649,268, U.S. Pat. No. 4,174,216, U.S. Pat. No. 4,282,308, U.S. Pat. No. 4,948,704 and U.S. Pat. No. 5,001,037, the disclosures of which are incorporated herein by reference.

Photohardenable compositions are generally a combination of polymeric binder and photopolymerizable monomers. Suitable binders include co(methyl methacrylate/methacrylic acid) and monoethyl ester of poly(methyl vinyl ether/maleic anhydride), each of which may be copolymerized in various proportions. Suitable photopolymerizable monomers include ethylenically unsaturated monomers which have been found useful are those disclosed in U.S. Pat. No. 2,760,863; U.S. Pat. No. 3,380,831 and U.S. Pat. No. 3,573,918. There may be mentioned as examples dipentaerytiritol acrylate (50% tetra and 50% penta), pentaerythritol triacrylate and tetraacrylate, polypropylene glycol (50) ether of pentaerythritol tetraacrylate, polyethylene glycol (200) dimethacrylate, dipentaerythritol triacrylate b-hydroxyethyl ether, polypropylene glycol (550) ether of pentaerythritol tetramethacrylate, pentaerythritol tetramethacrylate, polypropylene glycol (425) dimethacrylate, trimethylolpropane trimethacrylate, and polypropylene glycol (340) ether of trimethylol propane triacrylate. Also useful are epoxy monomers containing ethylene unsaturation, e.g., monomers of the type disclosed in U.S. Pat. No. 3,661,576 and British Patent No. 1,006,587. The binder may be varied widely in its ratio with the monomer but in general it should be in the range of 3:1 to 1:3. The monomer should be compatible with, and may be a solvent for, and/or have a plasticizing action on the binder. The choice and proportions of monomer and binder are made in accordance with the requirements of selective photoadherence.

When the pattern of tacky areas is not used immediately, or is stored or shipped, it is useful to keep the tacky areas clean by protecting them with a cover sheet such as a polyester film, polypropylene film, or silicone release polyester film. Generally a thin 0.0127 mm (0.0005 inch) MYLAR® polyester film (E. I. du Pont de Nemours and Company, Inc., Wilmington, Del.) is sufficient.

When using photosensitive compositions to create the array of tacky and non-tacky areas, the photosensitive composition is first applied to a suitable substrate and is then imagewise exposed to create the desired array of tacky and non-tacky areas. As discussed more fully below, the choice of substrate will largely depend upon the method selected to mount the array of particles to the contact pads. Generally speaking, however, the substrate should be stable under the conditions of intended use, smooth, and show good adherence to the photosensitive composition. As will be recognized by those skilled in the art, one or more intermediate layers may be applied to the substrate to improve adhesion of the photosensitive layer.

There should be facile control of the tacky areas with respect to size and placement. For the aforementioned photosensitive products, the array pattern is first composed by manual or computer assisted design, and is usually transferred to a photographic film that is used as a phototool in contact with the photosensitive product and with strong ultraviolet light to pattern the tacky array in the photosensitive product. For the CROMALIN® products, the photosensitive material would first be laminated to the clear substrate and then exposed through the phototool to create the pattern. The pattern could be made to coincide with the interconnect positions of a circuit board. For CROMATONE®, a clear plastic film substrate is provided with the product so that it may be exposed directly through the phototool. Other patterning methods include projection exposure and direct writing as in digital imaging using a laser output device.

With reference now being made to FIG. 1, an article or web 8 having an array of tacky and non-tacky areas suitable for use in accordance with the process of the invention is illustrated therein. In the embodiment shown, the article comprises a photosensitive layer 10 applied to a substrate 12. The photosensitive layer 10 has been imagewise exposed to produce alternating areas 14 which are non-tacky and areas 16 which are tacky. If the photosensitive layer 10 is a phototackifiable composition, the areas 16 would correspond to the exposed areas whereas if the photosensitive layer 10 is a photohardenable composition, areas 16 would correspond to the unexposed areas.

Figure 2:
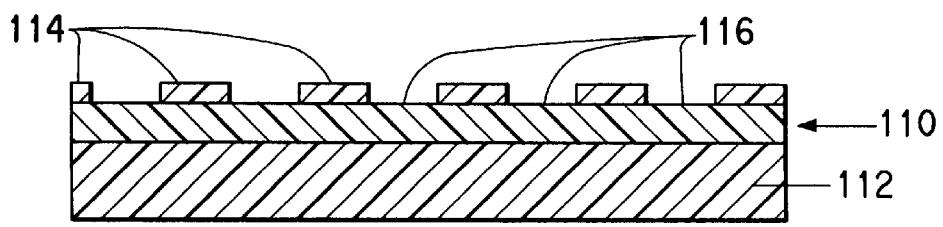
FIG. 2 is a simplified section view of another embodiment of a surface having an array of tacky and non-tacky areas thereon, which surface is suitable for use with the inventive process, wherein the tacky areas are disposed below the plane of the non-tacky areas.

Alternatively, the article may be formed by attaching a thin sheet material having an array of holes to an adhesive coated substrate. Examples of such sheet material include screen mesh or stencils wherein holes have been formed by, for example, laser ablation, punching, drilling, etching, or electroforming. The article may also be formed by providing photoresist hole patterns on an adhesive coated substrate. An example of such an alternate article or web 108 is illustrated in FIG. 2, wherein an adhesive layer 110 is applied to a substrate 112. A thin sheet material 114 having holes 116 therein is then applied over the adhesive layer 110. The adhesive layer 110 is exposed in the areas of the holes 116 in the sheet material 114. It will be apparent to those skilled in the art that a similar type of structure, that is, a non-tacky surface having recessed tacky areas, will also result from the use of certain photosensitive materials (e.g., negative CROMALIN® or CROMOTONE®) which produce a "peel-apart" image. Generally, the further the tacky area is recessed in relation to the non-tacky area, the more likely size exclusion will occur, where no particles larger than the width at the tacky area recess, will attach. This effect becomes particularly pronounced as the tacky area recess approaches the size of the tacky area, that is, the depth of the tacky area is approximately equal to its width.

Figure 3:
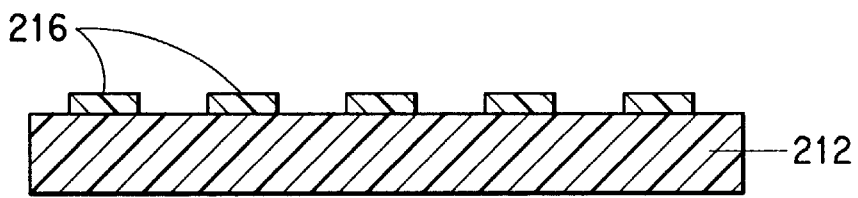
FIG. 3 is a simplified section view of still another embodiment of a surface having an array of tacky and non-tacky areas thereon, which surface is suitable for use with the inventive process, wherein the tacky areas are disposed above the plane of the non-tacky areas.

With reference now being made to FIG. 3, still another embodiment of an article or web 208 having an array of tacky and non-tacky areas suitable for use in accordance with the process of the invention is illustrated therein. In the embodiment shown, the article 208 comprises an array of tacky areas 216 on a non-tacky substrate 212.

It is noted that in the embodiment shown in FIG. 1, the tacky areas 16 are disposed co-planar with the non-tacky areas 14 whereas in the embodiment of FIG. 2, the tacky areas, corresponding to holes 116, are disposed below the plane of the sheet material 114, which defines the non-tacky areas. It is further noted that in the embodiment shown in FIG. 3, the tacky areas 216 are disposed above the plane of the non-tacky substrate 212.

This invention relates to an improved method for efficiently and precisely adhering particles to the tacky areas (as described above) on a surface containing an array of tacky and non-tacky areas and removing particles from the non-tacky areas without removing the particles from the tacky areas. This is discussed in depth in the section following this one.

Following the population process, in many applications for this invention, the array of mounted particles described above is transferred to contact pads of an electronic device. The contact pads are usually made of a conductive metal such as copper, aluminum, gold, or a lead/tin solder. In a preferred method of transfer of the mounted particles, an array having a single particle adhered to the tacky areas thereof is placed in contact with the contact pads of an electronic device such that the particles are placed in registered contact with each of the contact pads and the particles are then released from the tacky areas of the array and are adhered to the contact pads. This method will be referred to as the "transfer method". In an alternate method of transfer, the array of tacky and non-tacky areas is formed directly on the contact pads (such as by coating, laminating etc.) prior to the particles being adhered thereto. This method will be referred to as the "direct method".

In either the transfer method or the direct method, it is necessary to disassociate the particles from the tacky areas of the array. There are many alternate methods to accomplish this step, some of which are more applicable to either the direct method or the transfer method than to the other. For example, disassociation of the particles can be accomplished by mechanical forces, that is, an adhesive compound (e.g., a viscous flux, acting as an adhesive or having an adhesive component) can be applied to the contact pad. Upon contact of the solder ball to the adhesive compound, a bond forms which is stronger than the bond between the solder ball and the tacky area of the array. Thus, upon removal of the array from the contact pads, the particles are released from the tacky areas and remain adhered to the contact pads. Mechanical disassociation of the particles is particularly applicable to the transfer method.

Thermal disassociation is yet another method of disassociating the particles from the array. By thermal disassociation is meant the application of heat sufficient to cause the particles to melt, wet the surface of the contact pads and flow to cover the pads. Preferably, as the particles melt, the substrate is brought closer to the contact pads to make sure that all particles contact their respective contact pads. Spacers may be used to keep the surface uniformly off contact from the contact pads themselves so as not to squeeze solder beyond the contact pads.

The heat necessary to melt the particles may be provided by use of an oven, laser, microwave, infrared radiation or other convenient source. Temperatures in the range of 150° C. to 400° C. are normally sufficient to cause the reflow of the particles, particularly solder balls. It will be apparent to the skilled artisan that, in the event the substrate will be heated together with the particles, the substrate should be capable of withstanding such temperatures; that is, it should be thermally stable. Substrates such as KAPTON® (a polyimide film available from E. I. du Pont de Nemours and Company, Wilmington, Del.), quartz, glass and the like may be used to advantage. Likewise, with regard to the material used to form the tacky and non-tacky array, such material should not melt during the heat step, but rather could be thermally stable or, alternatively, could completely volatilize at such temperatures. Negative CROMALIN® in particular has a tendency to melt during an oven heating disassociation step and thus is largely unsuitable for use with oven heating. In the event that the heat source used will not heat the substrate or tacky and non-tacky areas (e.g., a laser), thermal stability is not of great concern.

Another method that may be used to disassociate the particles is photodisassociation. In this method, the tacky areas are exposed to actinic radiation whereby they lose their adhesive properties to disassociate the particle.

To improve the wetting and adhesion of the particle, particularly solder balls, to the contact pads, a suitable flux may be used. A solder flux combination (e.g., rosin types, no-clean types, organic acid or synthetic activated) can be coated on the pads areas and/or on the solder balls to help clean oxide layers from the pad and solder, improving wetting of the metallized pad by molten solder thereby effecting disassociation of the solder ball from the tacky area and adhesion thereof to the contact pad.

In the direct method, it is critical that the molten particle disassociate or displace the tacky area on the contact pad and completely wet the contact pad with the molten particle (e.g., solder). This could be accomplished by decomposing the tacky areas to volatile compounds when the melting temperature of the particles is reached or by using thermally stable tacky area materials that would be displaced by the molten particle.

Once the particles have been released from the tacky areas and melted, they are allowed to cool and resolidify on the contact pads, e.g., to form a solder bump.

Population Process

This invention is an improved process for populating an array of tacky and non-tacky areas with free-flowing particles, such as solder spheres. In populating the array of tacky and non-tacky areas, it is desired to effect placement of a controlled number of particles on each tacky area while insuring that there are no excess particles remaining in any area that is non-tacky, i.e., there should be no excess particles remaining in any non-tacky area at the end of the population process. Most often for electronic applications in particular, it is desirable to place precisely one particle on each tacky area.

In general, the population step may be accomplished in a number of ways. Generally the article with the pattern of tacky areas is placed in a container with an excess of particles and the container gently moved so as to allow the particles to move across the array until all tacky areas become occupied. Alternatively excess particles are sprinkled onto the tacky areas until all tacky areas are covered with particles. Excess particles are removed from the fully occupied pattern of tacky areas by gravity, gentle tapping, gentle blowing, vacuum and other methods. The force used in the clean up of excess particles depends on the adhesive strength of the bond between the tacky areas and the particles. This step, the application of free flowing particles to patterns of tacky areas, is accomplished best when electrostatic charging is avoided by using electrically conducting, grounded containers, humidified atmosphere and with the use of ion generators as in the use of ionized air. This step is further aided by a clean atmosphere to prevent the attachment of foreign matter to the tacky areas.

Figure 4:
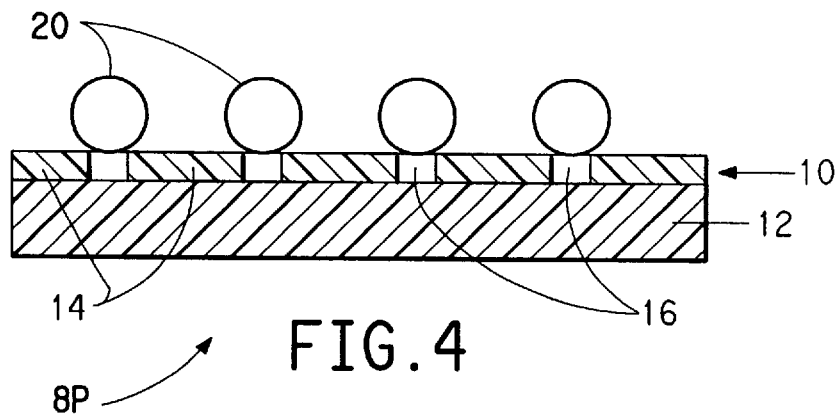
FIG. 4 is a simplified section view of the array of FIG. 1, shown in combination with a particle adhered to each tacky area.
Figure 5:
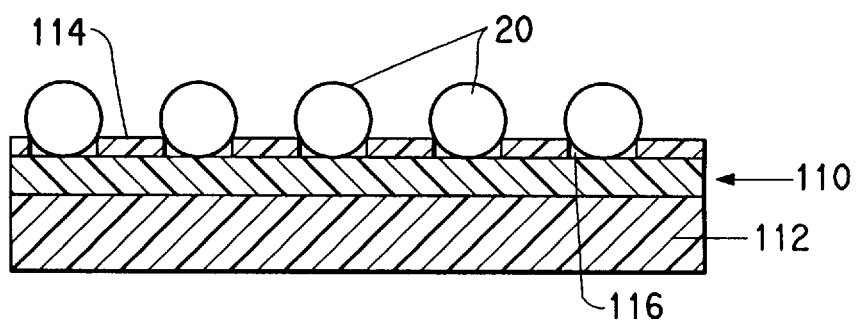
FIG. 5 is a simplified section view of the array of FIG. 2, shown in combination with a particle adhered to each tacky area.
Figure 6:
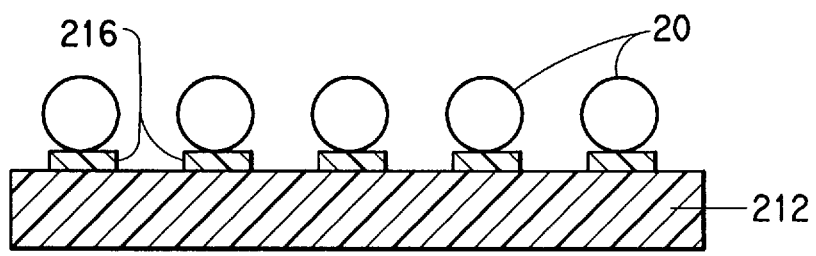
FIG. 6 is a simplified section view of the array of FIG. 3, shown in combination with a particle adhered to each tacky area.

FIGS. 4, 5, and 6 illustrate the different cases of the arrays shown in FIGS. 1, 2, and 3 respectively, with spherical particles 20 attached to the tacky areas 16, 116, and 216 of the array to form populated articles or webs 8p, 108p, and 208p, respectively.

The figures above showing particles attached to tacky areas of an array of tacky and non-tacky areas are schematic. It should be understood that these figures depict representation(s) not-to-scale. In actual practice of this invention, typically particles initially attach to tacky areas near the perimeter of the tacky area with relatively light wetting of the particle by the tacky area. Later, at equilibrium wetting, typically there is full or nearly full embedding of particles in the tacky areas with centering of the particles.

The process of attaching particles to patterns of tacky areas is aided by the tacky areas having sufficient tackiness to grab and hold the particles immediately upon contact. It is further desired for the attachment of the particle to the tacky area to be strong enough to withstand the various forces (e.g., vibrator, tapping, shaking, jiggling, moving, bumping contact, vacuum or blowing forces, etc.) that occur while populating the array with particles and during the removal of excess particles from the fully populated array. In addition, it is advantageous to have sufficient adhesive strength between the particles and the tacky areas to hold the particles in place during handling and possible shipment. Furthermore, tacky areas with a tackiness of at least 0.5 grams/mm² can be populated by particles, but it is preferred that the tacky areas have a tackiness of at least 2 g/mm² and it is most preferred that the tacky areas have a tackiness of at least 5 g/mm², especially when patterns of tacky areas populated with particles are to be shipped without loss of the particles.

The present invention is an improved method for effecting the adhering of particles to tacky areas on a surface containing an array of tacky areas and non-tacky areas such that any and all excess particles can be removed from the non-tacky areas without removing any particles from the tacky areas. Surprisingly and unexpectedly, it has been found that the overall efficiency (OEP) of the population process is significantly improved when the surface having an array of tacky and non-tacky areas with particles adhered thereon is held for a period of time of 2 to 60 minutes to allow the particles to adhere better to the tacky areas. The overall efficiency of the process is further significantly improved when the surface having an array of tacky and non-tacky areas with particles adhered is held for a period of time and at a temperature of at least 30° C. to allow the particles to adhere better to the tacky areas. It is believed the elevated temperature increases the adhesive properties of the tacky areas and speeds up the wetting process so a larger area contact between the particle and the tacky area is achieved in a shorter time. The elevated temperature should not have a substantial affect on the non-tacky area to change its non-tacky character and cause the particles to adhere thereto. The goal is perfect population with one particle per tacky area and no extras; with total errors (TE) per populated article of zero. Expressed as an equation:

$$TE = V + TW + EX$$

where

TE=total errors per article

V=total number of vacant tacky areas per article

TW=total number of extra particles associated with a tacky area or "twins" per article EX=total number of extra particles left on non-tacky areas per article Then the error rate ER for the populated surface becomes $$ER = 1,000,000(TE)/TA$$

where

ER=error rate in parts per million (ppm) tacky areas

TA=total number of tacky areas per article

TE=total errors per article

For almost all tacky areas small particles will attach to the edge of the tacky areas as soon as the particles flow across the tacky areas provided that the kinetic energy of the particle is less than the initial bonding strength of the particle to the tacky area. Once the tacky areas are buried with excess particles at rest the number of vacancies V is very low. Remaining vacancies can be filled by gentle agitation of the particles across the article with periods of rest and V becomes essentially zero. However, the number of excess particles TW+EX is near infinity. If sufficient cleaning force is applied all the excess particles can be removed and TW+EX becomes zero. To be successful the cleaning force must be enough to remove all the excess particles from the non-tacky areas yet the cleaning force must be less than the adhesive force between the particles and the tacky areas. We find that in many cases of freshly populated tacky areas that immediate attempts to remove the excess particles results in removing many particles from the tacky areas. The initial adhesion ($Adh_0$) of the particle to the tacky areas can be very low such that the forces applied to clean off excess particles TW+EX exceeds the adhesive force of the particle to the tacky area and V becomes large. This is particularly true with rough particles that are not wet well by the tacky areas (adhesion increases as the wetting area of the particle by the tacky area increases).

It has been found in this invention that holding the array of tacky and non-tacky areas with particles adhered thereon for a period of time and at a temperature of greater than or equal to 30° C. allows the particles to adhere and center better to the tacky areas. During this time the surface area of the particle wet by the tacky area increases, the particle is drawn deeper into the tacky area and the particle centers itself in the tacky area. This process stops when the particle penetrates through the tacky area and comes to rest in contact with the bottom of the tacky area or the circumferential rim of the tacky area. This process is quite slow at or near ambient temperature (e.g. 20° C.) taking an hour or more to reach equilibrium. The time to reach equilibrium depends on several factors including the thickness of the tacky area, the width of the tacky area, the viscosity of the tacky material, the surface energies of the tacky material and particles which determines wetting rates and characteristics. Heating the array of tacky and non-tacky areas covered with particles adhered thereon greatly speeds up the wetting process and adhesion build-up of the particles to the tacky areas during the hold period. There is a big advantage in quickly providing robust adhesion of particles to the tacky areas for it allows for cleaning off the excess particles shortly after they were applied without the loss of particles attached to the tacky areas making the overall process much more convenient and efficient. In some cases it may be advantageous to heat the particles also, or to just heat the particles and not the tacky areas when the particles have sufficient thermal inertia to retain their heat for a brief period of time until they engage a tacky area.

Suitable hold times for the methods of this invention vary with temperature in the heating step. Illustratively, for Method 2, the period of time in step (d), i.e., the hold time, can broadly range from 5 seconds to 45 minutes. When the temperature in step (d) is at least 30° C., the period of time in step (d) ranges from 10 seconds to 10 minutes. When the temperature in step (d) is at least 35° C., the period of time in step (d) ranges from 10 seconds to 4 minutes. When the temperature in step (d) is at least 40° C., the period of time in step (d) ranges from 5 seconds to 60 seconds. In special embodiments where the temperature is less than 30° C., the hold time can range from 2 minutes to 1 hour.

Another surprising benefit of these process improvements is centering of the particles in the tacky areas during the hold period with or without heating. With the correct match of tacky area thickness, width and particle geometry the wetting process that occurs during the hold period draws the particle to the exact center of the tacky area. It is believed that surface tension forces between the viscous tacky "liquid" and the particle surface play a dominant role in this centering process. The wetting process and centering action has been observed to occur equally well whether gravity is aiding or opposing the joining of the particle and tacky area. That is, the process has been demonstrated with the particle and tacky area on the topside or bottom-side of the substrate. This self-centering effect can be critical for aligning particles with receptor pads in a transfer process, especially when the spacing between particles and between pads is small relative to the particle size.

Figure 12:
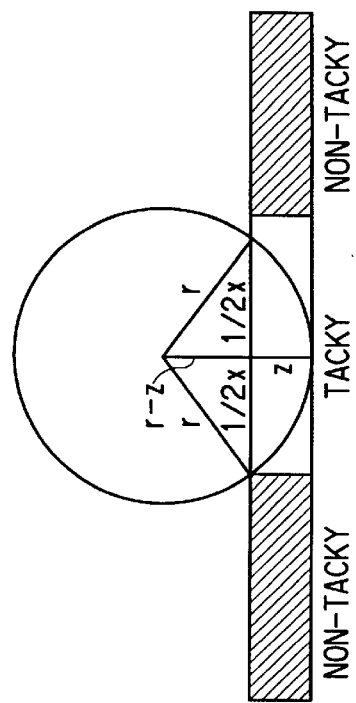
FIG. 12 illustrates the geometrical relationships involved for complete self-centering of a sphere of diameter 2 r in a tacky area of thickness z with contact diameter x and with the sphere penetrating all of the tacky area and resting on the bottom of the tacky area.

Complete centering depends on the tacky area diameter d being less than or equal to the wetting or contact diameter(x)

of a sphere for a particular sphere diameter (2 r) and tacky area thickness(z) as shown in FIG. 12. It is only under these conditions that the sphere rests on the perimeter of the tacky area and, by definition, is centered. The relationships of r, x and z are described in the equation:

$$r^2 = (0.5x)^2 + (r-z)^2$$

[Equation solved for x is as follows:

$$x = 2(2rz - z^2)^{1/2}]$$

where:

sphere radius=r contact diameter=x adhesive thickness=z approximate contact area=$3.1416(1/2x)^2$ Summarized below are some comparisons of observed contact diameter versus calculated contact diameter for several different sphere diameters and coating thicknesses.

| sphere diameter μ | coating thickness μ | calcd contact diameter μ | observed contact diameter μ |
|---|---|---|---|
| 127 | 3.0 | 38 | 37.5–42.9 |
| 127 | 4.0 | 44.4 | 41.6–50.0 |
| 127 | 6.0 | 53.9 | |
| 127 | 10.0 | 68.4 | |
| 300 | 4.0 | 68.8 | |
| 300 | 8.0 | 96.7 | |
| 300 | 24.0 | 162.8 | |

It is not critical that the centering part of the process be complete at the end of step (b) in Method 1. The centering process continues until equilibrium is reached or the adhesive is inactivated or the particle is removed. Depending on the need for centering in the final use of the array of tacky areas populated with particles, it could be advantageous to speed up the centering and bring it nearer completion by the end of step (c) in Method 1. Heating the surface having an array of tacky and non-tacky areas with particles adhered thereon is the best method for both speeding up the centering process and building adhesion between the particles and the adhesive areas.

Significant increases in the adhesion of particles to the tacky areas occur with a hold time of 30 to 60 minutes and some improvement is evident in 1 to 2 minutes at 21° C. For hold times of one minute or less the overall efficiency of the population process in this invention shows significant improvement when the temperature is 30° C. or higher, and broadly the invention can be practiced at any temperature at or above 30° C. Preferably, the population of the array of tacky and non-tacky areas is conducted at a temperature that is greater than or equal to 35° C. and less than the decomposition temperature of the tacky areas and less than the sticking temperature of the non-tacky areas. For photopolymers described in this invention the decomposition temperature of the tacky areas is greater than 100° C. and the sticking temperature of the non-tacky areas is dependent on the degree of photocuring and on the hold time. Although the non-tacky areas soften above 40° C. for a preferred composition for a light photocuring and above 60° C. for a strong photocuring, as shown in Example 1 population can still be very efficient at 50° C. as long as the hold time is short (6 seconds). Preferably, the population of the array of tacky and non-tacky areas is conducted at a temperature that is equal to or greater than 35° C. and which is less than or equal to 80° C. More preferably, the population of the array of tacky and non-tacky areas is conducted at a temperature that is equal to or greater than 35° C. and which is less than or equal to 65° C. Most preferably, the population of the array of tacky and non-tacky areas is conducted at a temperature that is equal to or greater than 35° C. and which is less than or equal to 50° C.

One method (Method 1) of this invention comprises the steps of:

(a) obtaining the surface having an array of tacky and non-tacky areas thereon;

(b) flowing the particles across the surface to allow particles to contact the tacky areas and adhere thereto; and (c) removing the excess particles not adhered to the tacky areas;

whereby heating to a temperature of at least 30° C. takes place prior to step (c).

In step (b), the number of particles that are flowed across the surface is normally and preferably in excess of the number of tacky areas in the array, such that 100% population of the tacky areas with at least one particle is possible.

In one preferred embodiment, the method (Method 3) of this invention comprises the steps of:

(a) flowing particles across the surface having the array of tacky and non-tacky areas at a temperature of at least 20° C.;

(b) heating the surface having the array of tacky and non-tacky areas with particles thereon at a temperature of at least 30° C.;

(c) agitating the surface having the array of tacky and non-tacky areas with particles thereon causing the particles to reposition across the surface to allow particles to contact and adhere to at least most tacky areas at a temperature of at least 30° C.;

(d) holding the surface having the array of tacky and non-tacky areas with particles adhered thereon for a period of time (hold-time) and at a temperature of at least 30° C. to allow the particles to adhere and simultaneously move toward centers of tacky areas; and (e) removing excess particles not adhered to tacky areas at a temperature of at least 20° C.

In particle flowing step (a) of Method 3, the number of particles that are flowed across the surface is normally and preferably in excess of the number of tacky areas in the array, such that 100% population of the tacky areas with at least one particle is possible. In hold step (d), the hold time and temperature is normally and preferably enough to increase the adhesion of the particle to tacky areas such that the adhesion becomes sufficient to exceed any forces applied during removal step (e). In removal step (e), the conditions are normally and preferably enough to overcome any forces that attract excess particles lying over the non-tacky areas but not enough to remove any particles adhered to tacky areas. The process of this invention can be conducted such that particle flowing step (a) and heating step (b) are executed sequentially with particle flowing step (a) being executed first or can be conducted such that particle flowing step (a) and heating step (b) are executed simultaneously or particle flowing step (a) can come after heating step (b) and before agitation step (c) or heating step (b) can come simultaneously with agitation step (c) or heating step (b) can come simultaneously with holding step (d). It is also still advantageous over prior methods if steps heating (b) and holding (d) come after steps particle flowing (a) and agitation (c). Steps heating (b) and holding (d) singly or together are important in centering the particles in the tacky dots and in reducing the time required to center and firmly adhere the particles for further handling and processing. This may be important in manufacturing processes where productivity is critical. A further embodiment allows the temperature of each step particle flowing (a), agitating (c), holding (d) and removing (e) to be controlled independently. A further embodiment allows the temperature within each step to be controlled as a function of time.

For example, there might be a benefit to having the heating (b) step occur only after particle flowing step (a) in the case where the adhesive properties of the tacky areas might be temperature sensitive and there is a possibility of an interruption of the process where the array of tacky and non-tacky areas on a surface is waiting for particle flowing step (a) to resume. Another possible benefit of controlling the temperature and hold time in this invention might be a case where the adhesion and embedding of the particle to the tacky areas needs to be limited to a certain value for the benefit of an unanticipated future use of the populated part.

The particles of this invention must be free flowing particles as defined supra, but, other than this requirement, can have any other properties as desired.

For many or most applications of this invention, it is desired to populate each tacky area of an array of tacky and non-tacky areas with one and only one particle. In order to populate each tacky area with one and only one particle, it is critical that the particle size be significantly larger than the size of the tacky area to be populated. In general, for cases involving population of tacky areas with various shapes, including irregular shapes, with particles of various shapes, including irregular shapes, a given tacky area should be no larger than about 30% of that of the particle. This value of 30% specifically applies for population of circular tacky areas with non-spherical particles. For spherical particles on circular tacky areas, it is suitable according to the invention to achieve a population of 1 particle for each tacky area when each tacky area is a circle having a diameter $d_1$ and each of the particles is a sphere having a diameter $d_2$, wherein $d_1/d_2$ is in the range from 0.1 to 1.0. Preferably, $d_1/d_2$ is in the range from 0.15 to 0.9. Most preferably, $d_1/d_2$ is in the range from 0.3 to 0.6.

The method for mounting particles on a surface having an array of tacky and non-tacky areas thereon can be practiced with a surface that is part of a discrete web or a surface that is part of a continuous elongated web. In the case of a discrete web, a piece of web with an unpopulated surface could be placed in an apparatus at a single station, the surface population steps carried out at the single station, the web removed and a new web with an unpopulated surface placed in the apparatus to repeat the process. In the case of a continuous elongated web, the web could be threaded through an apparatus and advanced to one or several stations to carry out the population steps, with the web stopping at one or several stations. The advancing of the web removes the populated surface and brings in a new unpopulated surface to repeat the process. If discrete populated web products are desired, they can be cut from the continuous web after population.

Figure 8:
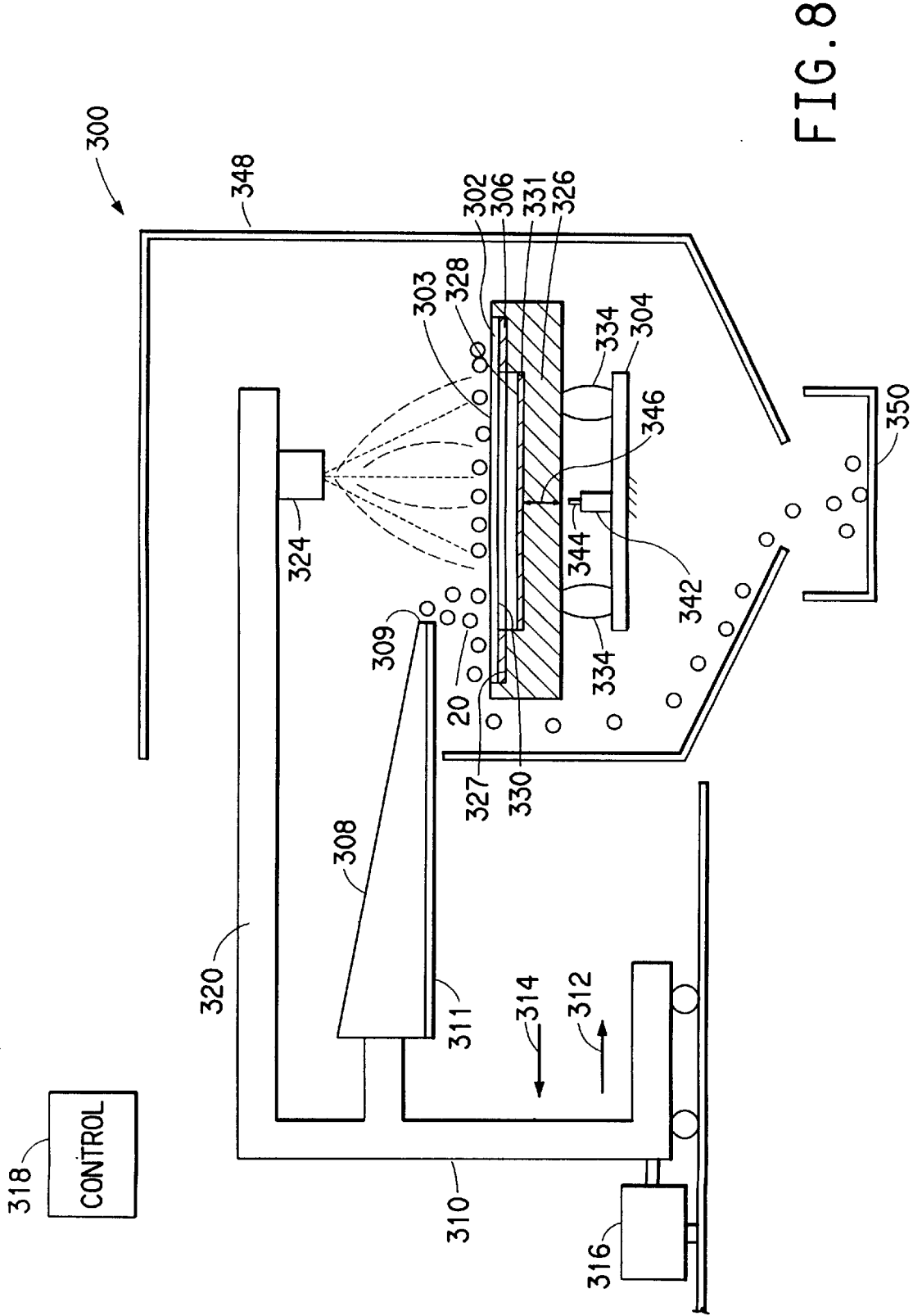
FIG. 8 is a schematic of an apparatus for mounting particles on a surface having an array of tacky and non-tacky areas thereon, wherein the surface is a discrete portion of web.

FIG. 8 shows a population device 300 that can be used to process a discrete web 302 having a surface 303 covered with arrays of tacky and non-tacky areas. The base 304 holds an annular web support ring 306 that may be clamped or taped in place. The web is attached to an annular web support ring 306 by tapping or clamping. Positioned beneath the web is a heating and agitating plate 326 which is adapted to hold the annular support ring 306 in a recess 327. An upper surface 328 of the plate is out of contact with the bottom-side 330 of the web 302. Above the web is a vibratory tray 308 attached to a moveable frame 310 that moves in the direction of arrows 312 and 314 being propelled manually or by an actuator 316. The actuator may be controlled by controller 318 as is the vibratory tray 308. The tray 308 extends across the width of the web 302 and has an outlet 309 on one side. The tray is filled with particles, such as particle 20, to be placed on the tacky dots on the web 302. The tray has a heating means 311 for heating the particles as they rest on the, tray bottom. The moving and vibrating tray acts as a particle dispenser to deliver particles 20 over the entire surface 303 of the web 302. Also mounted to the frame 310 is a bar 320 that holds an ionization air knife 324. The air knife is a known device that uses a row of ac corona discharge needles to ionize the surrounding air in a band. A sheet-like stream of flowing air is directed past the needles to forcefully distribute the ionized air over the web surface. The corona discharge function can be used effectively separate from the air function when air flow is not desired. The device 324 extends across the width of the web 302 and can be traversed over the length of the web by the action of the moving frame 310 to expose the entire surface 303 to the influence of ionized air.

The heating and agitating plate 326 has a heating means 331 that acts to heat the web 302 and the tacky areas thereon by convection and radiation. The plate 326 is attached to a fixed base 304 by way of vibration isolation mounts 334 at three or four corners of the plate (only two shown). The fixed base 304 is attached to part of a machine frame. Attached to the center of base 304 is an air cylinder 342 that is arranged to tap the bottom of plate 326 when a cylinder rod 344 is in the extended position. The cylinder is in communication with controller 318 to repeatedly tap the plate to agitate the frame 306 (and attached web) resting on the plate and thereby agitate the particles on the web. The agitation is generally in the direction of double ended arrow 346 to give a motion to the particle that has a vertical component generally perpendicular to the surface 303 of web 302. It is believed that contacting the web with another surface, particularly a grounded surface, inhibits neutralization of charges on the web. Therefore, the surface 328 of plate 326 is spaced away from the bottom-side of web 302 which is believed to facilitate the neutralization of charges on the web by ionization device 324 before and during the dispensing of particles onto the web. An enclosure 348 surrounds major portions of the population device as shown to contain the excess non-mounted particles for collection and reuse. A container 350 is at the bottom of the enclosure to capture the excess particles.

In operation, the web 302 is mounted on the annular support ring 306 with the image of tacky areas over the annular portion of the ring and facing away from the ring. If a cover sheet is used to protect the tacky areas of the web it would be removed at this time and the imaged web 302 would be treated with ionized air to neutralize the web. The ring with attached web would be placed in recess 327 and gravity could hold the ring in place. Particles such as solder spheres would be placed in the vibratory tray 308 in a quantity greatly in excess of what is required to populate the tacky areas. The heating means 311 in the tray would be continually energized to heat the particles as they rest in the tray. Heating means 311 provides one way of providing the desired heat to facilitate attachment and rapid centering of the particles on the tacky areas. It may be used separately as the sole heat source or in conjunction with the heating plate 326, or the heating plate 326 may be the sole source of heat in the process. The vibratory tray would be briefly cycled to distribute the spheres uniformly across the tray at the outlet. The ionizing device 324 would be turned on without the air flow to ionize the air surrounding the surface 303 of web 302 and actuator 316 would be in a position to place the outlet 309 of the vibratory tray at the left end of surface 303 as shown. The controller 318 would signal the vibrator to turn on and begin dispensing spheres that would fall from outlet 309 to the surface 303 of the web. Controller 318 would signal actuator 316 to move frame 310 to advance the vibratory tray from left to right so the outlet 309 dispensing the spheres travels across the web. When the outlet 309 reaches the right end of the web, the vibratory tray would be turned off and the actuator would be reversed under the control of controller 318 to return the tray to the left of the assembly. After the particles are dispensed, the controller 318 would signal the cylinder 342 to repeatedly extend and retract rod 344 to tap the plate 326 to further dispense the particles over the surface 303 of the web. This tapping will cause the spheres to hop up and down and collide with each other and move laterally on the web surface 303.

The tapping will continue for a given time at a preselected frequency or for a given number of taps until each tacky area has a sphere contacting it. The air pressure to the cylinder will determine the energy transmitted to the spheres. In general the energy should be such as to cause the spheres to travel 2–50 sphere diameters off of the web surface 303. The number of taps should be such as to fully populate all the tacky areas with spheres, but not so much as to generate an excessive electrostatic charge due to the motion of the spheres 20 on the surface 303. Generally 5–70 taps are sufficient to populate all the tacky areas without generating excessive electrostatic charge. Such a charge may cause "twins" where an unattached sphere attaches to an attached sphere on a tacky area, or extra spheres that cannot be removed from the non-tacky area. Between 5 and 15 taps have been found to populate the tacky areas well without generating excessive charging.

Tapping as a form of agitation has the characteristic of providing a dwell time between tap impulses that allows the spheres excited by the impulse of the tap to attach to a tacky area before the next impulse. A continuous sinusoidal vibration as a form of agitation was found to be less effective to aid population. With continuous vibration, it is believed the spheres were constantly being excited making it difficult for them to be engaged by the tacky forces. The tap duration is defined by applying and removing an impulse to the plate 326 and thereby the web and particles. The tap duration for the device 300 is the total time the cylinder rod is in contact with the plate 326. The dwell time between taps should be greater than a tap duration to provide time for the spheres to adhere to the tacky areas. To insure adequate dwell time during tapping, the tapping frequency should be less than 1000 taps per minute and preferably less than 500 taps per minute and most preferably less than 200 taps per minute. A frequency of about 0.5 to 3.0 and preferably 1.5 taps per second (90 taps per minute) has been found to work well. An air cylinder is useful for applying taps since the pressure can be easily varied to provide different energies to the particles. However, a rotating cam on a shaft with an eccentric that periodically strikes the plate 326 may also be an effective tapping device as may other means known to those skilled in mechanical arts. Lateral tapping may also work especially if it generates a vertical component of motion for the particles, but vertical tapping is preferred to avoid generating excessive lateral shear forces on the attached spheres that may more readily dislodge them from the tacky areas.

After the predetermined amount of tapping is complete, the controller stops the tapping and the web is held at rest adjacent heated plate 326. This heats the tacky areas so they will wet the surface of the spheres 20 quickly which plays a role in increasing the attachment force and the area contact with the sphere. After a predetermined hold time, the controller turns on the air flow to ionization air knife 324 which has already had the ac corona turned on. Controller 318 enables the actuator 316 to move the frame 310 from left to right to traverse air knife 324 across the web 302 to blow the unattached spheres remaining on the non-tacky areas of surface 303 off the web 302. The blown spheres 20 will fall in enclosure 348 and be captured in tray 350 from which they can be reused. This may complete the population process and the populated web can be removed and an unpopulated web placed in the device 300 and the process repeated. If additional centering action is desired for a particular set of conditions, it may be desired to continue with additional holding time at an elevated temperature before removing the populated web.

Several variations in the device are possible and still practice the population process of the invention for a discrete web. For instance, for some situations where electrostatic charges are not a problem, it may not be necessary to space the heating and agitating plate 326 away from the bottom-side 330 of the web 302. In this case, the upper surface 328 of plate 326 may contact the bottom-side 330 of the web to achieve conductive heat transfer. Manual actuation and control can be practiced thereby eliminating controller 318. If heating of the particles is not required, heating means 311 may be omitted; if heating of the tacky areas is not required, heater 331 may be omitted. Alternatively or in addition to heating with heaters 311 and 331 is to heat the air in enclosure 348 so all elements of the device are at an elevated temperature that would tend to heat the tacky areas and particles. These modifications can still produce results that are an improvement over the prior art for populating particles on tacky areas.

Figure 9:
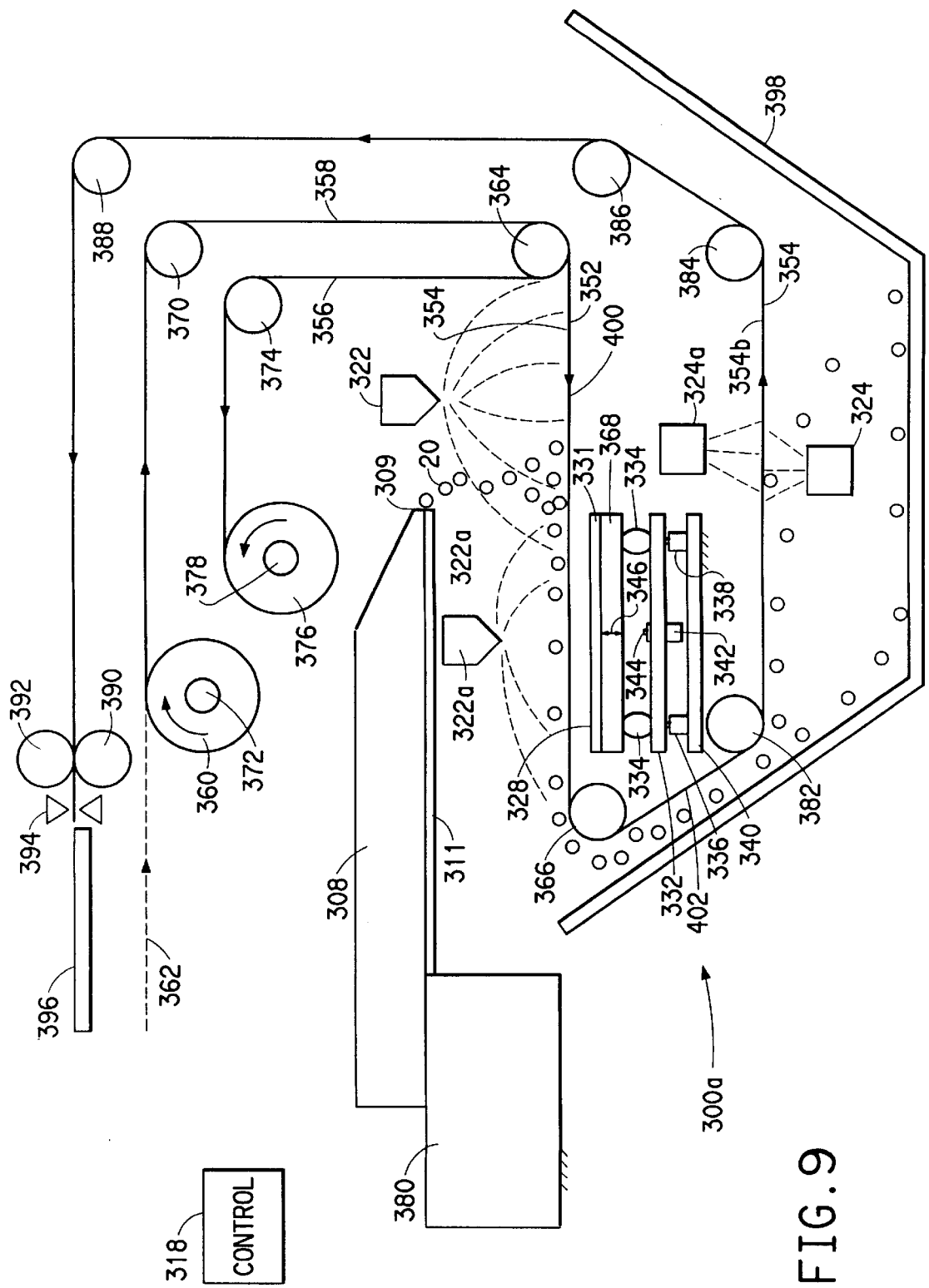
FIG. 9 is a schematic of an apparatus for mounting particles on a surface having an array of tacky and non-tacky areas thereon, wherein the surface is a continuous elongated web.

FIG. 9 shows a population device 300a that can be used to process a continuous elongated web 352 having a surface 354 having repetitive arrays of tacky and non-tacky areas. In this case, the web 352 would be presented to the device combined with a continuous elongated cover 356 to form a protected composite web 358. The web 358 could be provided from a discrete roll 360 or could be provided from a previous web treatment process as indicated by dashed lines 362, such as an imaging process. The device 300a comprises a first web support roller 364 and a second web support roller 366 that support web 352 over a heating and agitating plate 368 positioned beneath the web. The heating and agitating plate 368 can be raised and lowered (shown lowered) so upper surface 328 can be in or out of contact with the bottom-side 400 of the web 352. The plate has a heating means 331 that acts to heat the web 352 and the tacky areas thereon. The plate 368 is attached to a moving frame 332 by way of vibration isolation mounts 334 at three or four corners of the plate (only two shown). The moving frame 332 is attached to actuators, such as actuators 336 and 338 that are attached to mounting plate 340 that is part of a machine frame. The actuators would be in communication with control 318 for coordination with other machine elements. In the up position, the actuators place the upper surface 328 of the heating plate in contact with the bottom-side 400 of the web. Also attached to the center of moving frame 332 is an air cylinder 342 that is arranged to tap the bottom of plate 326 when a cylinder rod 344 is in the extended position. The cylinder is in communication with controller 318 to repeatedly tap the plate to agitate the web resting on the plate and thereby agitate the particles thereon. The agitation is generally in the direction of double ended arrow 346 to give a motion to the particle that has a vertical component generally perpendicular to the surface 354 of web 352. When the actuators are in the down position, the surface 328 of plate 368 is spaced away from the bottom-side of web 352. As explained referring to FIG. 8, this is believed to facilitate the neutralization of charges on the web by ionization devices.

The incoming composite web 358 is additionally guided by roller 370 and is tensioned by a braking device 372 acting on roll 360. The cover 356 is additionally guided by roller 374 and is collected in a discrete roll 376 tensioned by a winding device 378 acting on roll 376. Positioned above the web 352 are ionization devices 322 and 322a. Also above the web 352 is a vibratory tray 308 having an outlet 309 and heating means 311 as in FIG. 8 for dispensing particles 20. The vibratory tray is fixed to a machine frame at position 380. Web 352 is further guided by rollers 382, 384, 386, and 388 before passing between driven roller 390 and nip roller 392. The web 352 passes under nip roller 392 with the tacky area surface 354 facing roller 392 which is relieved in the central portion to avoid contact with any of the tacky areas. Cutting means 394 and holding table 396 are adjacent driven roller 390 and in the path of web 352. Between rollers 382 and 384, the web is transported horizontally and passes between ionizing air knife 324 directed at the web surface 354 and 324a directed at the opposite web surface 354b. Beneath the device 300a is a container 398 for collecting excess particles 20. Controller 318 is used to control the various elements of the device 300a.

In operation of the device 300a, an elongated composite web 328, having multiple repeating tacky and non-tacky arrays imaged thereon, would be provided from roll 360 and would be threaded over roller 370 and support roller 364. Cover 356 would be peeled off of the composite web at roller 364 leaving web 352 to proceed to support roller 366. Cover 356 would proceed over roller 374 to roll 376 where it will be wound, driven by winding device 378. Web 352 would be threaded over rollers 382, 384, 386, and 388 and through the nip formed by driven roller 390 and nip roller 392. Driven roller 390 may be propelled by a servo motor, stepping motor, or the like under the control of controller 318 to achieve precise movement of web 352. Control of braking device 372 by controller 318 will provide tension control for web 352 and composite web 358. Control of winding device 378 by control 318 will provide tension control for web 356.

The web is stopped to position a complete tacky area array over heating and agitating plate 368 and under ionization device 322a, and another adjacent array under ionization device 322. During advance of the web 352, the plate 368 is retracted to avoid rubbing contact with web 352 which would generate electrostatic charges that would be difficult to neutralize. It is significant that the web 352 is not contacting any surfaces between support rollers 364 and 366 to thereby provide good conditions for electrostatic charge neutralization During advance of the web 352, vibratory tray 308 is energized to dispense particles 20 through outlet 309 to fall onto the static neutralized web 352. As the particles are cascading onto web 352, one repeat of the multiple tacky arrays on web 352 passes by the outlet 309 so one entire array is covered by this relative motion between web 352 and outlet 309. When the covered array stops over plate 368, the vibratory tray is deenergized and the flow of particles from outlet 309 stops. It may be desirable to position the outlet 309 so that when the web 352 stops, the outlet is over a gap between multiple arrays and particles will only be dispensed onto the array present over plate 368. The rollers 390 and 392, cutting means 394, and holding table 396 must be positioned so that when the array stops over plate 368, a populated array also is positioned with the gap between arrays located at the cutting means 394. The cutting means can then be actuated by controller 318 to cut between the arrays and thereby separate one populated array from the continuous web 352 as desired for further handling.

When the covered array stops over plate 368, actuators 336 and 338 are signalled by controller 318 to raise plate 368 to contact the bottom-side 400 of web 352. The heated plate quickly heats the tacky areas on the web. The controller activates cylinder 342 to extend rod 344 to tap the center of plate 368 to agitate the particles on the web. After a predetermined time or number of taps, the tapping stops and the web is held at rest for a predetermined time during which the web is heated. After the predetermined hold time, the plate 368 is retracted out of contact with web 352 and the controller causes driven roller 390 to advance the web a distance of one tacky array. As the just populated array passes over support roller 366, the particles on the non-tacky areas of the array progressively cascade down off the web and are collected in container 398. The progressive cascading and the angled web path at 402 prevent a large quantity of particles from coming off the web all at once that might dislodge the particles attached to the tacky areas. The flexibility of the web permits this progressive change in path over roller 366.

As the web with previously populated arrays is moving between rollers 382 and 384 the controller turns on air flow to air knives 324 and 324a positioned between the rollers. The ac corona to the air knives may remain on continuously. Air knife 324 acts to blow off excess particles that may still be temporarily adhered to the non-tacky areas as the moving web 352 passes by knife 324. Air knife 324a similarly acts to blow off any particles that may have inadvertently fallen onto the back-side of the web 352. When the web motion stops for the next cycle, the air flows to air knives 324 and 324a are turned off by controller 318. After stopping the web motion, controller 318 also activates holding table 396 to grasp populated web 352 with a vacuum while cutting means 394 is cycled to cut the web between populated arrays. The entire cycle just described can now repeat for the next tacky array on the continuous elongated web. Such an automated device 300a for populating a continuous web offers productivity advantages and labor savings not possible before.

Referring to FIG. 9, there can be several variations to the hold time for the populated web in the process. A first hold time may occur beginning just after the particles have been agitated and the web is resting on heated plate 368 and before the web is indexed off plate 368 to present a new array for populating. During this time no forces are applied to the excess particles to try to remove them that may result in disturbing the particles on the tacky areas. A second hold time may occur beginning just after the web has been advanced to move the just populated array off the plate 368 and over the roller 366. Many of the excess particles will fall off the web due to gravity as the web is bent over roller 366, but the excess particles will not yet have been aggressively removed by air jets or vibrations. During this hold time the particles on the tacky areas have not been disturbed and may still be undergoing additional wetting by the tacky material to improve adhesion and centering. This second hold time extends until the populated array is advanced past the air knife 324 during one of the web advances. A third holding time may occur beginning just after the excess particles have been aggressively removed by air knife 324 and before the array leaves the apparatus environment after rollers 390 and 392. During this time, additional heat may be applied to further accelerate centering of the particles if they have not yet reached the limits of centering. The first, second, and third hold times are controlled times when the populated web may be treated with independently controlled heating means or may not be heated for predetermined times to improve adhesion and centering before the populated web is handled for further use.

Variations in the device 300a are possible and still practice the population process of the invention. For instance, different heating means may be employed to heat the tacky areas between support rollers 364 and 366. Hot air convection heating may be employed with the air directed at the surface 354 and/or back-side 400. Radiant heating may also be alternatively employed or employed in combination with other heating means and directed at the surface 354 and/or back-side 400 of web 352. When these alternate variations are employed, heating plate 368 may be omitted and an alternate agitating means be employed. For instance, a tapping cylinder may be employed at each support roller 386 and 388 to agitate the particles on the web. It may also be possible to direct a focused impulse of pressurized air at the middle of the back-side 400 of the web to induce agitation of the particles. A dwell time between impulses would be included to allow the particles an opportunity to adhere to the tacky areas.

Figure 10:
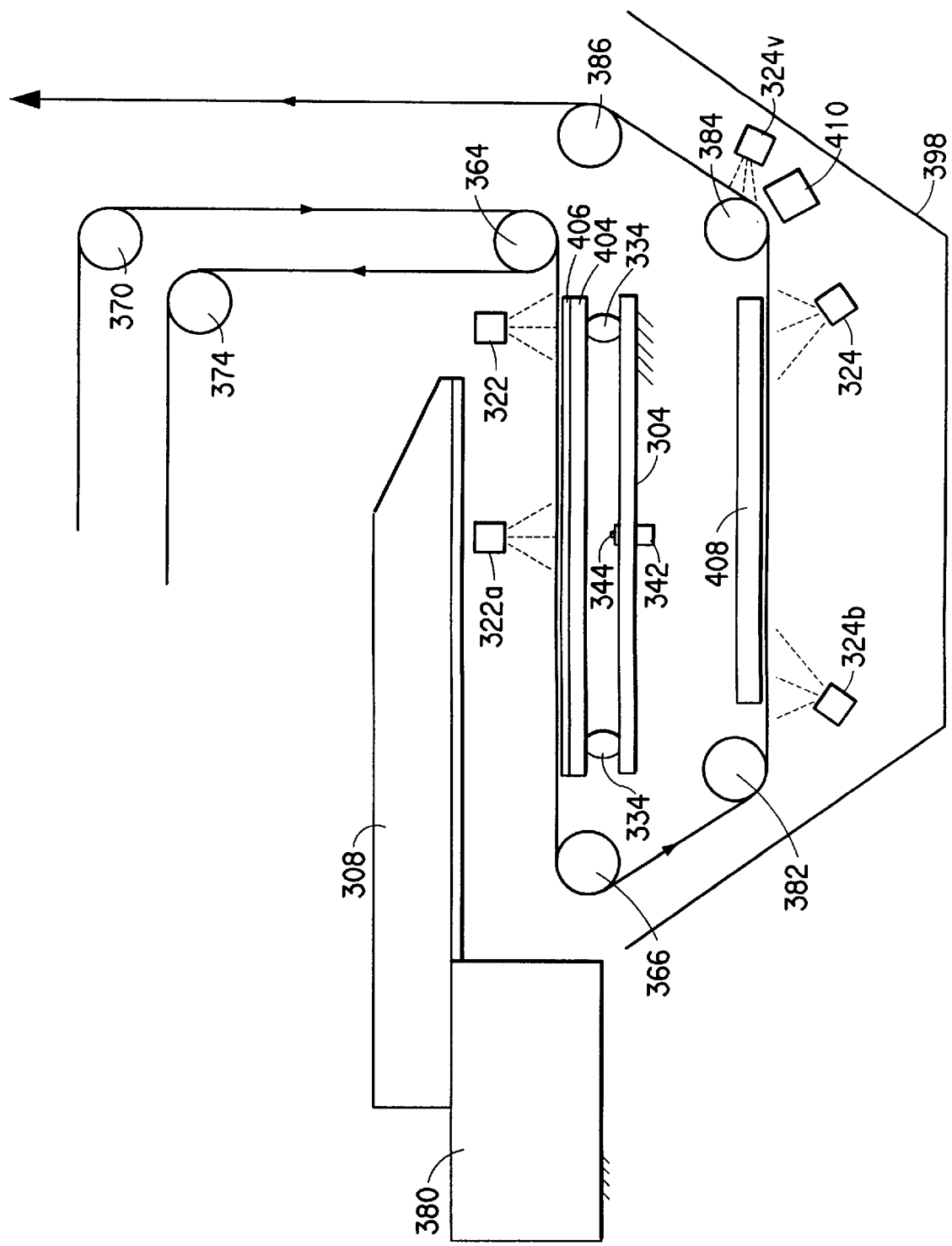
FIG. 10 is an alternate embodiment of the apparatus of FIG. 9.

FIG. 10 shows a further variation of the device of FIG. 9 for populating using a continuous elongated web. One notable difference with the FIG. 9 embodiment is the absence of raising and lowering of the heating and agitating plate 404 of FIG. 10. The desirable spacing of the plate from the back-side 400 of the web 352 to facilitate neutralization of static charges and eliminate rubbing contact during web advancing can be accomplished by alternate means. In one alternative, the plate 404 can be carefully spaced away from the web 352 when it is under full tension used for advancing. When the advancing is stopped, the web tension can be relaxed by braking device 372 of driven roller 390 to allow the web to come into contact with plate 404. Plate 404 can also have a top surface 406 that is porous (such as a sintered metal surface) and that has a vacuum applied therethrough to insure good contact with web 352 for good heat transfer for heating the tacky areas. In another alternative, the plate 404 with porous top surface 406 can be positioned to contact the web even under full advancing tension. To avoid actual contact during advancing, a pressurized flow of air can be applied to the porous surface 406 which will raise the web above the plate 404 on a cushion of air. When it is desired to make contact with the web 352 for heat transfer to the tacky areas, the pressurized air would be turned off and a vacuum engaged to pull the web 352 into good contact with plate 404.

Another notable difference between the FIG. 9 and FIG. 10 embodiments is the addition of a vibratory plate 408 between rollers 384 and 382. The surface of the plate would be closely spaced to web 352 so that during vibration, plate 408 would contact web 352 and would agitate the excess particles in the non-tacky areas to dislodge them from the web 352. During advancing of the web, vibratory plate 408 would be turned off and would not contact the web 352. Two air knives 324 and 324b would be directed at the tacky area side of web 352 to aid in removing excess particles.

Figure 11:
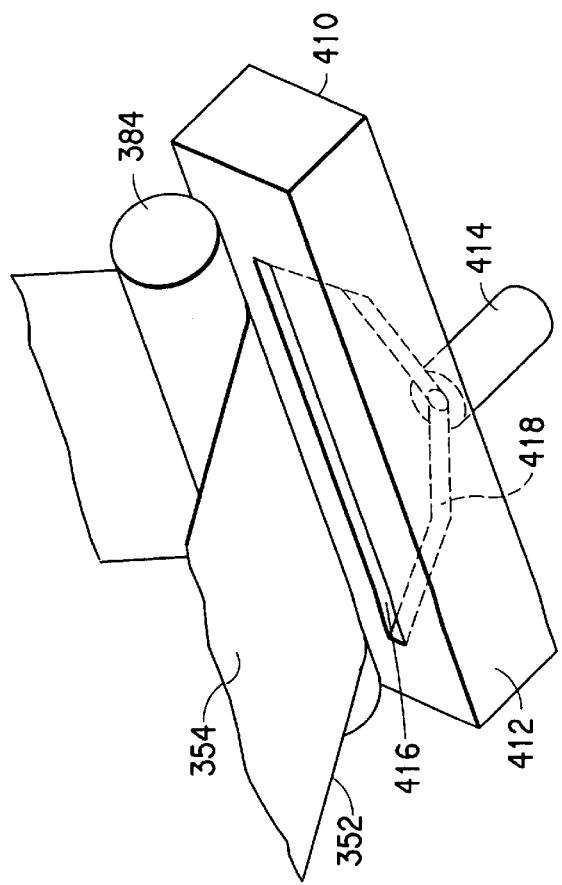
FIG. 11 is an enlarged view of roll 384 from FIG. 9 or 10 showing an alternative particle removing means comprising a vacuum.

Another notable difference is the addition of another ionization air knife 324v and a vacuum device 410 at support roller 384 to act as an excess particle remover and collector. The air knife 324v is positioned closely adjacent the device 410 with the air stream directed at the space between the device 410 and the web 352 as it passes over roller 384. If desired, another ionization air knife can be added on the opposite side of the vacuum device to further assist in removing excess particles and directing them into the vacuum device. The combined vacuum device 410 and air knife 324v are useful for replacing the two air knives 324 and 324b when it is desired to reduce the air turbulence within container 398 and still provide agressive removal of excess particles. The combination may also be used in addition to the air knives 324 and 324b when additional removal capacity is required. The vacuum device 410 is shown in more detail in FIG. 11 where the air knife 324v is omitted for clarity. The vacuum device comprises a housing 412 and conduit 414 in communication with a vacuum source (not shown). The housing 412 contains a slot 416 extending across the width of the web 352 and a plenum 418 in communication with the slot 416 and conduit 414. The slot is closely spaced from the surface 354 of the web 352 as it is tightly held on roller 384 by tension in the web 352. The tension and wrap angle over roller 384 keeps the web from being drawn up against the vacuum device 410 by the vacuum forces that are removing the excess particles from the surface of the web.

A vacuum device may also be used with the devices 300 and 300a of FIGS. 8 and 9, respectively. In the case of FIG. 8, the vacuum device, such as device 410 (FIG. 11), would be attached to bar 320 and the plate 326 may have to include a porous top surface which would also have a vacuum applied to hold the web 302 tightly against the upper surface 328 of plate 326 during vacuum removal of particles from the surface 303 of the web. This would prevent the web from coming into contact with the vacuum device due to the vacuum forces that are removing the excess particles from the surface of the web. This is required since there is no applied web tension over a wrap angle to securely hold the web in place as there is in FIGS. 9 and 10.

The region (of the Heater Plate) to the left of the Vibratory Feeder lip 55 becomes a heated hold area where the temperature of the particles and tacky areas can be controlled to enhance adhesion and centering of the particles to the tacky areas. The hold area continues beyond rollers 25 and 30 and optionally across to roller 100. Although not shown, this remaining hold area optionally could be temperature controlled as well. One possibility would be to use a high temperature, up to 120° C., in the initial area of the hold area, then cool down to near ambient temperature for the areas where the excess particles are removed.

The population area could be divided into zones with independently controlled temperatures so that the steps (a), (b) and (c) can be independently controlled. In fact it could be advantageous to cool or not heat (a) and (b) if the continuous web stopped moving.

The methods of this invention will afford populated surfaces having an array of tacky and non-tacky areas in which almost all of the tacky areas of the surface are populated with one particle per tacky area upon completion of execution of the method. Typically, there will be at least 99.99% of tacky areas of the surface populated with one particle per tacky area.

The methods of this invention will afford populated surfaces having an array of tacky and non-tacky areas in which very few particles remain attached to non-tacky areas upon completion of execution of a given method. Typically, there will be fewer particles than one per 10,000 that remain in the non-tacky areas.

EXAMPLES

Example C-1

The photosenstive layer of the unimaged tacky dot film used in the examples that follow had the following composition:

| Ingredient | Amount (g) | % by Weight |
|---|---|---|
| Poly(methyl methacrylate), MW* = ~250,000 | 6.97 | 12.18 |
| Poly(methyl methacrylate), MW* = ~20–40,000 | 9.39 | 16.41 |
| Pentaerythritol triacrylate | 14.54 | 25.41 |
| Tetraethylene glycol dimethacrylate | 9.02 | 15.77 |
| Monoacrylate of resin from bisphenol A and epichlorohydrin, MW* = ~3,500 | 12.53 | 21.90 |
| 2,2'-Bis(o-chlorophenyl)-4,4',5,5'-tetraphenyl-biimidazole | 4.18 | 7.31 |
| 4,4'-Bis(diethylamino)benzophenone | 0.251 | 0.44 |
| Leuco Crystal Violet (Aldrich Chemical Co., Milwaukee, WI) | 0.275 | 0.48 |
| 1,4,4-Trimethyl-2,3-diazobicyclo-(3.2.3)-non-2-ene-dioxide | 0.0286 | 0.05 |
| 4-Methoxyphenol | 0.0286 | 0.05 |
| *MW = weight average molecular weight | 57.2132 | |

The photosensitive layer was coated onto KAPTON® E (50 microns thickness, DuPont, Wilmington, Del.) and dried to give a dry coating thickness of the photosensitive layer of 3 to 25 microns.

The unimaged tacky dot film was imaged in the examples using contact exposure through a phototool by ultraviolet light at 365 nm and exposure level of 5 to 20 millijoules/$cm^2$.

Example 1

This example illustrates the value of heating tacky dot images in the process of net (overall) populating the tacky dots. Solder spheres of 125 micron diameter were used in this example.

A tacky dot film with a pattern of 23,000 tacky dots 75 microns in diameter and 4 microns thick on 50 micron thick KAPTON® E (DuPont, Wilmington, Del.) was discharged with an ion fan (Field Service Ionizer, Richmond Technology, Inc., output 4 to 7 KV). The film is attached with adhesive to a 6×6" steel flex frame and placed on a hot plate, contacting the bottom-side of the film opposite the tacky pattern. The film was held 60 seconds to equilibrate with the temperature of the hot plate. Temperatures of the plate and film were independently determined using thermocouples. The sample and equipment were contained in a class 100 cleanroom at 49 to 52% relative humidity and 69 to 70° F. A FSI ionizing air fan blew ionized air across the sample throughout the process. Solder spheres, 125±12.5 microns of 63 Sn/37 Pb, Indium Corp., (Utica, N.Y.) were uniformly sprinkled on the entire tacky dot pattern covering about one half of the surface.

Immediately a pneumatic tapper shook driven by 50 psi air pressure shook the sample 15 times over 12 seconds causing the balls to jiggle about on the tacky dot pattern. Next the sample was held still with a 6 second dwell time then tapping resumed and 3 seconds later an air knife which afforded air at 60 psi pressure was swept across the sample and back at a height of 3.25 inches blowing off the excess solder spheres.

The tacky dot film populated with one solder sphere per tacky dot was visually analyzed using a video microscope in all four quadrants for a partial representation of total population. A total of 2,977 sites of the overall 28,392 sites were checked for population.

| Plate T. ° C. | Film T. ° C. | Hold time sec | Number of Vacant sites | Number of populated sites | % Populated |
|---|---|---|---|---|---|
| 21 | 21 | 6 | 105 | 2872 | 96.47 |
| 21 | 21 | 6 | 478 | 2499 | 83.94 |
| 33 | 30 | 6 | 20 | 2957 | 99.32 |
| 33 | 30 | 6 | 60 | 2917 | 97.98 |
| 45 | 40 | 6 | 1 | 2976 | 99.96 |
| 45 | 40 | 6 | 1 | 2976 | 99.96 |
| 57 | 50 | 6 | 1 | 2976 | 99.96 |

From this data it is clear that moderate increases in film temperature dramatically increases the % population (percent population=efficiency of net population) of tacky dot sites. In this and all later examples, Plate T.=plate temperature and Film T.=film temperature, both measured in °C.

Example 2

The procedure of this example was the same as in Example 1 except that the hold time was 30 seconds before the air knife was turned on. Results obtained are given below.

| Plate T. ° C. | Film T. ° C. | Hold time sec | Number of Vacant sites | Number of populated sites | % Populated |
|---|---|---|---|---|---|
| 21 | 21 | 30 | 176 | 2801 | 94.08 |
| 33 | 30 | 30 | 21 | 2956 | 99.29 |
| 45 | 40 | 30 | 2 | 2975 | 99.93 |

Again it is clear from the above results that population of the film sample containing an array of tacky and non-tacky areas is more efficient (higher % populated) with increasing temperature of the film sample during the net population process.

Example 3

The procedure of this example was the same as for Example 2 except that the hold time was 60 seconds before the air knife was turned on.

| Plate T. ° C. | Film T. ° C. | Hold time sec | Number of Vacant sites | Number of populated sites | % Populated |
|---|---|---|---|---|---|
| 21 | 21 | 60 | 103 | 2874 | 96.54 |
| 21 | 21 | 60 | 85 | 2892 | 97.14 |
| 33 | 30 | 60 | 18 | 2959 | 99.39 |
| 33 | 30 | 60 | 4 | 2973 | 99.86 |
| 45 | 40 | 60 | 0 | 2977 | 100 |
| 45 | 40 | 60 | 1 | 2976 | 99.96 |

Again it is clear from the above results that population of the film sample containing an array of tacky and non-tacky areas is more efficient (higher % populated) with increasing temperature of the film sample during the net population process.

Example 4

This example was carried out in the same manner as in Example 1 except that the temperature was held constant at 21° C. and the hold time was varied as shown below. The results obtained are given below.

| Plate T. ° C. | Film T. ° C. | Hold time sec | Number of Vacant sites | Number of populated sites | % Populated |
|---|---|---|---|---|---|
| 21 | 21 | 6 | 292 | 2685 | 90.19 |
| 21 | 21 | 30 | 176 | 2801 | 94.08 |
| 21 | 21 | 60 | 94 | 2883 | 96.84 |
| 21 | 21 | 130 | 14 | 2963 | 99.53 |
| 21 | 21 | 130 | 18 | 2959 | 99.40 |

The results obtained in this example illustrate that a longer hold time without heating before the air knife cleaner is turned on results in greatly increased net population efficiency (% population) of the tacky dot sites on each given sample.

Example 5

This example was carried out in the same manner as in Example 1 except that the hot plate was off to start, the hold time was 130 seconds before the air was turned on and the film temperature was varied between the initial population and air knife clean-up steps.

| Population Plate T. ° C. | Hold Time sec. | Hold and Air Knife Plate T. ° C. | Number of Vacant Sites | Number of Populated Sites | % Populated |
|---|---|---|---|---|---|
| 21 | 130 | 21 | 16 | 2961 | 99.46 |
| 21 | 130 | 40 | 0 | 2977 | 100 |
| 40 | 130 | 40 | 3 | 2974 | 99.89 |

The results obtained in this example illustrate that heating during the hold (and clean-up) results in increased net population efficiency (% population) of the tacky dot sites on each given sample. Heating before and during the sprinkling of particles onto the tacky areas, as seen in the last line of data above, does not seem to significantly improve net population; in this case it was somewhat worse.

Example 6

This example illustrates the effect of tacky dot temperature on the rate of attachment and self-centering of solder spheres. In this example, tacky dot temperature refers to the temperature of the film containing an array of tacky and non-tacky areas, and tacky dot thickness refers to the thickness of the film containing an array of tacky and non-tacky areas.

A pattern of tacky dots on 50 micron thick KAPTON® E film was populated with 125 micron 63 Sn/37 Pb solder spheres and immediately turned upside down and used to cover a hole in a sheet aluminum spacer on a microscope's hot stage. Using a combination of reflected and transmitted light the tacky dots and attached solder spheres were viewed immediately through the KAPTON® E. The perimeter of the tacky dots and the contact area of the solder spheres were in sharp focus while the solder sphere appears as a dark shadow.

Figure 7A:
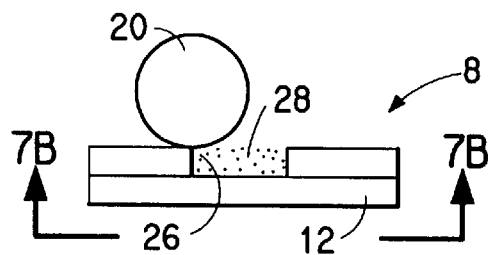
FIG. 7A is section view of a spherical particle initially adhering to a tacky area on a substrate.

FIG. 7A illustrates the web 8 of FIG. 1 in the condition where a spherical particle 20 first engages the corner 26 of a tacky dot 28 on a substrate 12. In FIG. 7B, which is a view looking in the direction of arrows 7B—7B of FIG. 7A, the dark circle 30 represents the contact area on the surface of the particle 20 that is wetted by the viscous tacky polymer of the tacky dot 28. The solid line circle represents the perimeter of the viscous tacky dot 28. The dashed line circle represents the particle diameter which appears as the dark shadow when actually viewing the particle through the translucent web from the bottom-side.

The following observations were made. The contact area 30 of the solder sphere 20 most often starts at the perimeter of the tacky dot 28 and was initially small relative to the area of the tacky dot. With time the contact area of the solder sphere 20 was seen to increase as it is wet more and more by the tacky dot 28.

Figure 7C:
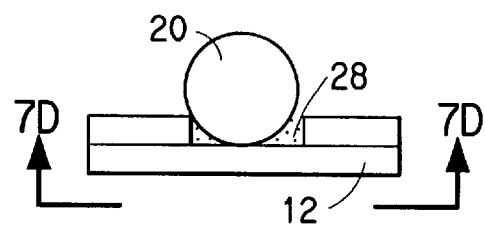
FIG. 7C is the section view of FIG. 7A after a predetermined dwell time when the condition is that the spherical particle contacts the substrate before contacting the tacky dot circumference.
Figure 7B:
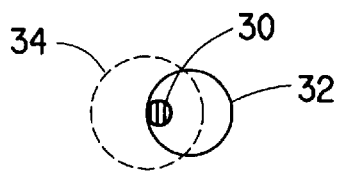
FIG. 7B is a plan view of FIG. 7A looking through the translucent substrate and tacky area.
Figure 7D:
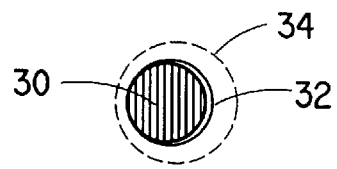
FIG. 7D is a plan view of FIG. 7C looking through the translucent substrate and tacky area.
Figure 7E:
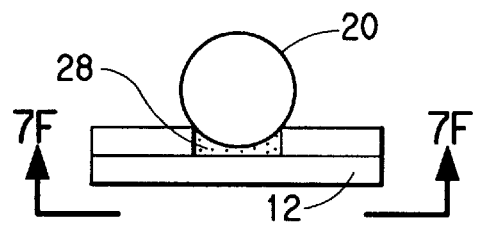
FIG. 7E is an alternative section view of FIG. 7A after a predetermined dwell time when the condition is that the spherical particle contacts the tacky dot circumference before the particle contacts the substrate.
Figure 7F:
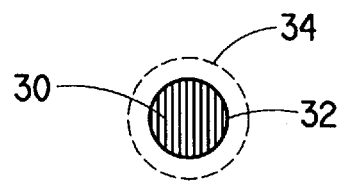
FIG. 7F is plan view of FIG. 7E looking through the translucent substrate and tacky area.

FIG. 7E illustrates the condition of FIG. 7A after a substantial hold time has taken place and wherein the relationship of the particle diameter, tacky dot diameter, and tacky dot thickness result in the particle contacting the entire perimeter 32 of the tacky dot surface before it bottoms out on the substrate 12. FIG. 7F illustrates view 7F—7F of FIG. 7E.

In case of FIGS. 7E and 7F the contact area 30 grew until it matched the diameter 32 of the tacky dot 28 in which case the solder sphere 20 had rimmed out and was centered over the tacky dot (this is case listed as ca. centered in the table below under position at equilibrium).

FIG. 7C illustrates the condition of FIG. 7A after a substantial hold time has taken place and wherein the relationship of the particle diameter, tacky dot diameter, and tacky dot thickness result in the particle bottoming out on the substrate 12 before the particle contacts the entire perimeter 32 of the tacky dot surface. FIG. 7D illustrates view 7D—7D of FIG. 7C.

In the case of FIGS. 7C and 7D the solder sphere 20 contact area increased until the sphere had sunk through the tacky dot 28 and rested against the KAPTON® film in which case it had bottomed out and was partially and substantially centered on the tacky dot (this is the case listed as bottomed out in the table below under position at equilibrium).

The contact area was observed until no further change was observed with time in which case equilibrium had been reached. Time to equilibrium is a measure of the embedding rate of the solder spheres in the tacky dots.

| Tacky dot diameter (microns) | Tacky dot thickness (microns) | Tacky dot temperature (° C.) | Time to equilibrium (minutes) | Position at equilibrium |
|---|---|---|---|---|
| 55 | 3 | 21 | 30 | bottomed out |
| 55 | 3 | 40 | 6 | bottomed out |
| 55 | 4 | 40 | 6 | ca. centered |
| 55 | 4 | 50 | 2 | ca. centered |
| 55 | 4 | 60 | 1 | ca. centered |

This example illustrates that increasing the tacky dot temperature substantially decreases the time for embedding and centering of solder spheres in tacky dots. It also shows that a 4 micron thickness is sufficient to center a 125 micron solder sphere in a 55 micron tacky dot whereas a 3 micron thickness results in a bottomed out situation before there is nearly complete centering. Thus in the latter case there is only partial centering of the sphere with respect to the tacky dot (tacky area).

Calculations show that for a 4 micron thick adhesive area and a 127 micron (5 mil) sphere the tacky dot must be 44.4 microns in diameter or less for complete centering. For a 3 micron thick adhesive the tacky dot must be 38 microns or less for complete centering. Thus with the 55 micron tacky dot and 4 micron coating the particle can be 5.3 microns off center. For the 3 micron adhesive the particle can be 8.5 microns off center.

Example 7

This example recognizes that spherical particles are wet by tacky adhesive photopolymer, sink through the adhesive coming to rest on the support film with the embed sphere having different contact areas depending on the tacky area thickness.

Glass beads 75 microns in diameter were applied to various thicknesses of Positive CROMALIN® C/P (6BX) photopolymer color proofing film (DuPont Company) on a polyester support film. The beads were observed to sink through the tacky adhesive photopolymer and come to rest touching the support film. The contact diameter of the bead in the photopolylmer was directly observed with a microscope by viewing the beads through the support film.

| Adhesive thickness | Contact diameter | Calculated Contact Diameter |
| --- | --- | --- |
| 6 microns | 40 microns | 40.7 microns |
| 18 microns | 63 microns | 64.1 microns |

Example 8

This example, using arabidopsis seeds, illustrates that increased hold time increases the adhesion of particles to adhesive areas so that fewer vacancies occur in the removal of excess particles.

Negative CROMALIN® photopolymer color proofing film (DuPont Company) was laminated to glass microscope slides and exposed with ultraviolet light through a phototool with 150 micron diameter transparent dots separated center-to-center by 1000 microns in a square array pattern. The coversheet was peeled off revealing an array of about 800 adhesive dots with a 150 microns diameter and a 1000 micron pitch. A sieved fraction of arabadopsis seeds between 250 and 300 microns in size was sprinkled on the slide and held various times before tapping off the excess seeds. The number of unoccupied (vacant) tacky areas were counted and examined for contamination. The vacancies appeared to be due to poor adhesion. The number of vacancies declined as the adhesion increased as the result of the hold times until a steady state was reached in about 1 hour.

| Hold time | Vacancies |
| --- | --- |
| 0 minutes | 22% of 800 dots empty |
| 5 minutes | 15% |
| 30 minutes | 8% |
| 60 minutes | 3% |
| 210 minutes | 3% |

Example 9

This example shows that brief heating of an array of particles mounted on tacky areas increases the adhesion of the particle to the adhesive area faster than without heating.

Example 8 was repeated and immediately after application of the seeds the slide with the tacky areas covered with seeds was heated briefly with a heat gun. After 1 to 2 minutes the excess seeds were tapped off the slide. The number of vacancies was between 5 and 10%; far fewer than the 22% at zero hold time and 15% at 5 minute hold time of Example 8. Clearly heating improves adhesion of the seeds to the tacky areas and reduces vacancies.

Example 10

This example illustrates that heating an array of particles mounted on adhesive areas for 5 minutes in an oven increases adhesion and resistance to water of the particles adhered to the adhesive areas.

CROMATONE® photopolymer color proofing film (DuPont Company), much like the film in Example 8, was patterned with 12 adhesive areas of 0.044, 0.055, and 0.062 inches in diameter and covered with millet seeds that did not pass through a 0.040 inch mesh sieve. After 10 minutes at ambient temperature the excess seeds were removed by spilling them off using a gentle circular motion. The adhesion of the seeds to the 12 adhesive areas was tested by soaking the populated film in water for 2.5 hours, removing the film from water and checking for loss of seeds. From 8 to 25% of the seeds came off. By contrast holding for 30 minutes at ambient before soaking in water no seeds (0%) detached. Again, the longer hold time improves adhesion of particles to adhesive area.

Another pattern of 96 tacky areas each 0.055 inch in diameter was covered with millet seeds, held at ambient temperature for 5 minutes, heated in a 58° C. oven for 5 minutes, cooled for 2 minutes and soaked in water for 1.5 hours. Only 2 seeds (2%) became loose. Heating appears to improve adhesion as seen by resistance to detachment by water.

Example 11

This example is the first example wherein the tacky dot pattern is heated before solder spheres are sprinkled over the adhesive areas, heated during the hold time, and cooled as the excess solder spheres are removed from the non-adhesive areas using an AC corona air knife.

The film, image and solder spheres of Example 1 were used in an example done by hand using a hot plate heat source and a stainless steel tray container. The film with a pattern of 23,000 tacky dots 52 microns in diameter and 4 microns thick was stripped of its coversheet, discharged in the ionized air from an AC corona and placed in a stainless steel tray that was preheated on a 40° C. hot plate. The film was thoroughly heated for 2 minutes. Then a monolayer of 125 micron solder spheres was gently sprinkled over the film until the pattern of adhesive areas was covered. The film covered with solder spheres was held for 1 minute on the 40° C. hot plate. Then the tray and film were allowed to cool. The excess solder spheres were blown off the cooled film using an AC corona air knife under 40 psi air pressure. The resulting pattern was very clean with no twins (TW) and no extra solder spheres (EX) but had about 5% vacancies. The process was repeated on the same sample adding a little shaking to complete the population of all tacky areas before blowing off the excess to give 100% population, no vacancies, no twins (TW) and 5 extras (EX).

Example 12

This example illustrates the process of the invention using an apparatus similar to that in FIG. 9 where the humidity is low and there is no ground plane adjacent to the web during ionization. The environment surrounding the apparatus during the test was 73.8° F. ambient air temperature at about 15% relative humidity. Solder spheres the same as in Example 1 were used. The tacky dot film was the same as Example 1 and was referred to as TH2 available from the DuPont Company of Wilmington, Del. The imaged film enters as an elongated continuous web of TH2 coated KAPTON® with the desired tacky dot image covered with MYLAR®. At roll 1 the MYLAR® coversheet is removed. An AC corona device between the MYLAR® and TH2 coated Kapton® creates ionized air near roll 1 to neutralize electrostatic charges (large) on the two films. Importantly there is no ground plane under the KAPTON®. It is believed a ground plane contacting the web during air ionization inhibits true neutralization of the web and particles. In the same zone, a vibratory feeder sprinkles solder spheres onto the TH2/KAPTON® under the influence of the AC corona, with no heat, and with no ground plane near the TH2/KAPTON®. The Tacky Dot image covered with solder spheres moves over a 40° C. hot plate while avoiding sliding contact with the plate that may create electrostatic charges. The film stops over the hot plate and, as tension in the web relaxes slightly, the film contacts the plate for heating the film to about 35° C. The hot plate is supported at the corners by vibration isolation mounts which are resting on a rigid shelf mounted on the backplate. The air cylinder tapper is rigidly mounted on the shelf and hits the bottom of the vibration isolated hot plate in the center and retracts allowing the hot plate to move freely with each tap which in turn vibrates the solder spheres up and down vertically with a little lateral movement as the spheres strike one another during agitation. It is believed a dwell between hits allows the spheres contacting a tacky area to be engaged before the next hit. The sample is tapped for 10 seconds at 35° C. (60 psi air on tapper, at a frequency of 1.5 taps per second). The sample is held at 35° C. for 30 seconds after tapping stops. The sample is conveyed over roll 2, down at approximately a 120 degree angle to roll 3 where the film travels horizontally with the populated part upside down. Most of the excess solder spheres progressively cascade off without contacting other spheres stuck to downstream tacky areas as soon as the film passes roll 2. The populated part continues advancing until it passes over an AC corona air knife operated at 40 psi which cleans off any remaining spheres in the non-tacky area without dislodging spheres attached to a Tacky Dot. The imaged pattern is visually examined and was observed to be nearly perfect with about one missing and one extra sphere for the pattern that has more than 20,000 Tacky Dots.

Example 13

This example illustrates the effect of tapping frequency, pressure and duration in the process of this invention on population efficiency. Example 12 was repeated tapper air pressure, tapper frequency and tapper duration and two temperatures were compared for the tapping and hold steps.

| Tap Freq (cpm) | Tap Time (sec) | # of Taps | Tap Pressure (psi) | Hold (sec) | Temp (° C.) | Vacancies (per 28,392) | Extras (per 28,392) |
|---|---|---|---|---|---|---|---|
| 96 | 10 | 16 | 60 | 30 | 35 | 5 | 9 |
| 96 | 10 | 16 | 90 | 30 | 35 | 10 | 28 |
| 96 | 30 | 48 | 60 | 0 | 35 | 2 | 33 |
| 58 | 30 | 29 | 60 | 30 | 21 | 7 | 9 |
| 58 | 30 | 29 | 60 | 0 | 21 | 7 | 4 |
| 96 | 30 | 48 | 60 | 30 | 21 | 7 | 12 |
| 200 | 30 | 100 | 60 | 30 | 21 | 11 | 53 |

From the above data increasing the tap frequency from 58 to 200 cycles per minute increased extra spheres from 9 to 53 per 28,392. Increasing tap pressure from 60 to 90 psi increased extras from 9 to 28 per 28,392. In both cases the vacancies slightly increased as well. Increasing the tap duration from 10 seconds or 16 taps to 30 seconds or 48 taps also increased extras from 9 to 33 per 28,392. At zero taps (data not shown) the number of vacancies goes to several hundred or a few thousand per 28,392. For the above conditions the ideal conditions for less extra solder spheres are between 0 and 16 taps at 60 psi tapper air pressure and a tapper frequency of 50 to 100 cycles per minute or less.

What is claimed is:

1. An improved method for mounting particles on a surface having an array of tacky and non-tacky areas thereon, comprising the steps of:

(a) obtaining the surface having an array of tacky and non-tacky areas thereon at ambient temperature;

(b) flowing the particles across the surface to allow particles to contact the tacky areas and adhere thereto with the proviso that each of the tacky areas has a size suitable for adhesion of only one particle per tacky area; and (c) removing the excess particles not adhered to the tacky areas; whereby the tacky areas are heated to a temperature of at least 30° C. as the particles are adhered thereto prior to step (c) so that the particles move toward the centers of the tacky areas.

2. The method of claim 1 further comprising:

(d) holding the surface having the array of tacky and non-tacky areas with particles adhered thereon for a period of time and at a temperature of at least 30° C. to allow particles to move toward centers of tacky areas;

wherein steps (b), (d) and (c) are executed in sequence.

3. The method of claim 1 wherein the heating takes place in step (a).

4. The method of claim 1 wherein the heating takes place in step (b).

5. The method of claim 1 further comprising:

(e) agitating the surface having the array of tacky and non-tacky areas;

wherein step (e) is executed prior to step (c) and wherein the agitation rate is less than 1000 cycles per minute.

6. The method of claim 1 further comprising applying ionized air to the surface of the array of tacky and non-tacky areas to at least partially neutralize electrostatic charges.

7. The method of claim 1 wherein fewer particles than one per 10,000 remain in the non-tacky areas.

8. The method of claim 1 wherein at least 99.99% of tacky areas of the surface are populated with one particle per tacky area upon completion of execution of the method.

9. The method of claim 1 wherein the heating and step (b) are executed sequentially wherein the heating occurs after step (b) and before step (c).

10. The method of claim 1 wherein heating and step (b) are executed simultaneously.

11. The method of claim 2 wherein heating and step (d) are executed simultaneously.

12. The method of claim 5 wherein heating and step (e) are executed simultaneously.

13. The method of claim 1 wherein the surface having the array of tacky and non-tacky areas is heated at a temperature in a range from 30° C. to 80° C.

14. The method of claim 13 wherein the surface having the array of tacky and non-tacky areas is heated at a temperature in a range from 35° C. to 80° C.

15. The method of claim 14 wherein the surface having the array of tacky and non-tacky areas is heated at a temperature in a range from 35° C. to 65° C.

16. The method of claim 15 wherein the surface having the array of tacky and non-tacky areas is heated at a temperature in a range from 35° C. to 50° C.

17. The method of claim 2 wherein the period of time in step (d) is in the range of 5 seconds to 45 minutes.

18. The method of claim 17 wherein the period of time in step (d) is in the range of 10 seconds to 10 minutes when the temperature in step (d) is at least 30° C.

19. The method of claim 18 wherein the period of time in step (d) is in the range of 10 seconds to 4 minutes when the temperature in step (d) is at least 35° C.

20. The method of claim 19 wherein the period of time in step (d) is in the range of 5 seconds to 60 seconds when the temperature in step (d) is at least 40° C.

21. The method of claim 1 wherein the particles are electrically-conducting particles.

22. The method of claim 21 wherein the electrically-conducting particles are metallic.

23. The method of claim 22 wherein the metallic particles comprise solder.

24. The method of claim 1 wherein the particles are electrically-insulating particles.

25. The method of claim 24 wherein the particles are selected from the group consisting of polymeric beads, glass beads, and seeds.

26. The method of claim 1 wherein each tacky area is a circle having a diameter $d_1$ and each of the particles is a sphere having a diameter $d_2$, wherein $d_1/d_2$ is in the range from 0.1 to 1.0.

27. The method of claim 26 wherein $d_1/d_2$ is in the range from 0.15 to 0.9.

28. The method of claim 27 wherein $d_1/d_2$ is in the range from 0.3 to 0.6.

29. The method of claim 1 wherein the tacky areas are substantially circular dots having a diameter d that is less than or equal to the contact diameter x of the spherical particle of radius r on a tacky area of thickness z where the contact diameter x is defined by $x=2(2rz-z^2)^{1/2}$.

30. The method of claim 1 wherein the array of particles are applied to contact pads of an electronic device, comprising the steps of:

(f) providing the surface having an array of tacky and non-tacky areas thereon each tacky area having one particle adhered thereto obtained from step (e);

(g) placing the particles in contact with an electronic device having contact pads such that the particles on the array are placed in registry with the contact pads; and (h) disassociating the particles from the tacky areas and adhering the particles to the respective contact pads.

31. The method of claim 1 wherein the array of particles are applied to contact pads of an electronic device, comprising the steps of:

(i) providing a surface having an array of tacky and non-tacky areas thereon to contact pads of an electronic device such that the tacky areas are in registry with the contact pads;

(j) adhering one particle to each tacky area to form an array of particles; and (k) disassociating the particles from the tacky areas and adhering the particles to the contact pads.

32. The method of claim 1 wherein each of the tacky areas has a tackiness of 2 to 6 grams/mm$^2$ and each of the particles has a diameter of 0.127 mm to 0.762 mm.

33. The method of claim 1 wherein each of the tacky areas has a tackiness of at least 2.0 grams/mm$^2$.

34. An improved method for mounting and subsequently transferring particles on a surface having an array of tacky and non-tacky areas thereon to a substrate, comprising the steps of:

(a) obtaining the surface having an array of tacky and non-tacky areas thereon at ambient temperature;

(b) flowing the particles across the surface to allow particles to contact the tacky areas and adhere thereto with the proviso that each of the tacky areas has a size suitable for adhesion of only one particle per tacky area;

(c) vibrating, at not greater than 1000 cycles per minute, the surface having the array of tacky and non-tacky areas with particles thereon causing the particles to reposition across the surface to allow particles to contact and adhere to all tacky areas;

(d) holding the surface having the array of tacky and non-tacky areas with particles adhered thereon and stopping the vibrating in step (c) for a period of time of at least two minutes to allow the particles to adhere and to move toward the centers of the tacky areas;

(e) removing the excess particles not adhered to the tacky areas after completing step (d); and (f) transferring particles adhered to tacky areas to the substrate.

35. The method of claim 34 wherein the substrate includes contact pads of an electronic device.

36. The method of claim 34 whereby the vibrating comprises tapping which comprises a dwell time and a tap, the tap having a duration defined by applying and removing an impulse to said surface and particles, the dwell time between taps being greater than a tap duration to provide time for the particles to adhere to the tacky areas.

37. The method of claim 36 wherein the tapping is at a frequency of between 0.5 and 3.0 taps per second for a total of 5 to 70 taps with a dwell time between taps to allow the particles to adhere to the tacky areas, the tapping imparting a vertical component of motion to the particles.

38. An improved method for mounting and subsequently transferring particles on a surface having an array of tacky and non-tacky areas thereon to a substrate, comprising the steps of:

(a) obtaining the surface having the array of tacky and non-tacky areas thereon at ambient temperature;

(b) flowing the particles across the surface to allow particles to contact the tacky areas and adhere thereto with the proviso that each of the tacky areas has a size suitable for adhesion of only one particle per tacky area;

(c) agitating at not greater than 1000 cycles per minute the surface having the array of tacky and non-tacky areas with particles thereon, causing the particles to reposition across the surface to allow particles to contact and adhere to all tacky areas;

(d) holding the surface having the array of tacky and non-tacky areas with particles adhered thereon and stopping the agitating in step (c) for a period of time to allow the particles to adhere and to move toward the centers of the tacky areas;

(e) removing excess particles not adhered to the tacky areas after completing step (d), whereby the tacky areas are heated to a temperature of at least 30° C. as the particles are adhered thereto prior to step (e); and (f) transferring particles adhered to tacky areas to the substrate.

* * * * *